United States Patent
Babbs et al.

(10) Patent No.: US 8,827,618 B2
(45) Date of Patent: Sep. 9, 2014

(54) TRANSPORT SYSTEM

(71) Applicants: Daniel Babbs, Austin, TX (US); Robert C. May, Austin, TX (US)

(72) Inventors: Daniel Babbs, Austin, TX (US); Robert C. May, Austin, TX (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 13/692,749

(22) Filed: Dec. 3, 2012

(65) Prior Publication Data

US 2013/0333174 A1 Dec. 19, 2013

Related U.S. Application Data

(60) Provisional application No. 61/566,443, filed on Dec. 2, 2011.

(51) Int. Cl.
*H01L 21/677* (2006.01)
*H01L 21/673* (2006.01)

(52) U.S. Cl.
CPC ........ *H01L 21/673* (2013.01); *H01L 21/67736* (2013.01); *H01L 21/67769* (2013.01); *H01L 21/6773* (2013.01); *H01L 21/67733* (2013.01); *Y10S 414/14* (2013.01)
USPC ....................................... 414/217.1; 414/940

(58) Field of Classification Search
CPC ...................................................... H01L 21/00
USPC ............................................. 414/217.1, 940
See application file for complete search history.

(56) References Cited

U.S. PATENT DOCUMENTS

| | | | | |
|---|---|---|---|---|
| 6,223,886 B1 * | 5/2001 | Bonora et al. | ............. | 198/465.2 |
| 6,494,308 B2 * | 12/2002 | Bonora et al. | ............. | 198/465.2 |
| 6,881,020 B2 * | 4/2005 | Chang et al. | ............... | 414/217.1 |
| 6,990,721 B2 * | 1/2006 | Mariano et al. | ................. | 29/469 |
| 8,272,827 B2 * | 9/2012 | Bufano et al. | ............. | 414/217.1 |
| 8,529,185 B2 * | 9/2013 | Hirasawa et al. | ........... | 414/749.6 |
| 2005/0095087 A1 * | 5/2005 | Sullivan et al. | ............... | 414/217 |
| 2006/0104712 A1 * | 5/2006 | Bufano et al. | ..................... | 404/1 |
| 2008/0063496 A1 * | 3/2008 | Bufano et al. | ........... | 414/331.01 |
| 2013/0089396 A1 * | 4/2013 | Bufano et al. | ........... | 414/222.01 |

* cited by examiner

*Primary Examiner* — Telly Green
(74) *Attorney, Agent, or Firm* — Perman & Green, LLP; Colin C. Durham

(57) ABSTRACT

A semiconductor workpiece processing system including at least one substrate processing tool that has a common housing with a first side having a first substrate holding container interface and a second side having a second substrate holding container interface having a different orientation than the first substrate holding container interface, a first transport section disposed corresponding to the first side of the tool, a second transport section being separate and distinct from the first transport section and interfacing with the first transport section and being configured to transport the substrate holding container between the first transport section and the tool and between the first side and the second side of the tool, the second transport section including at least one overhead gantry disposed above the tool, where the second transfer section is capable of interfacing with at least the second substrate holding container interface.

20 Claims, 19 Drawing Sheets

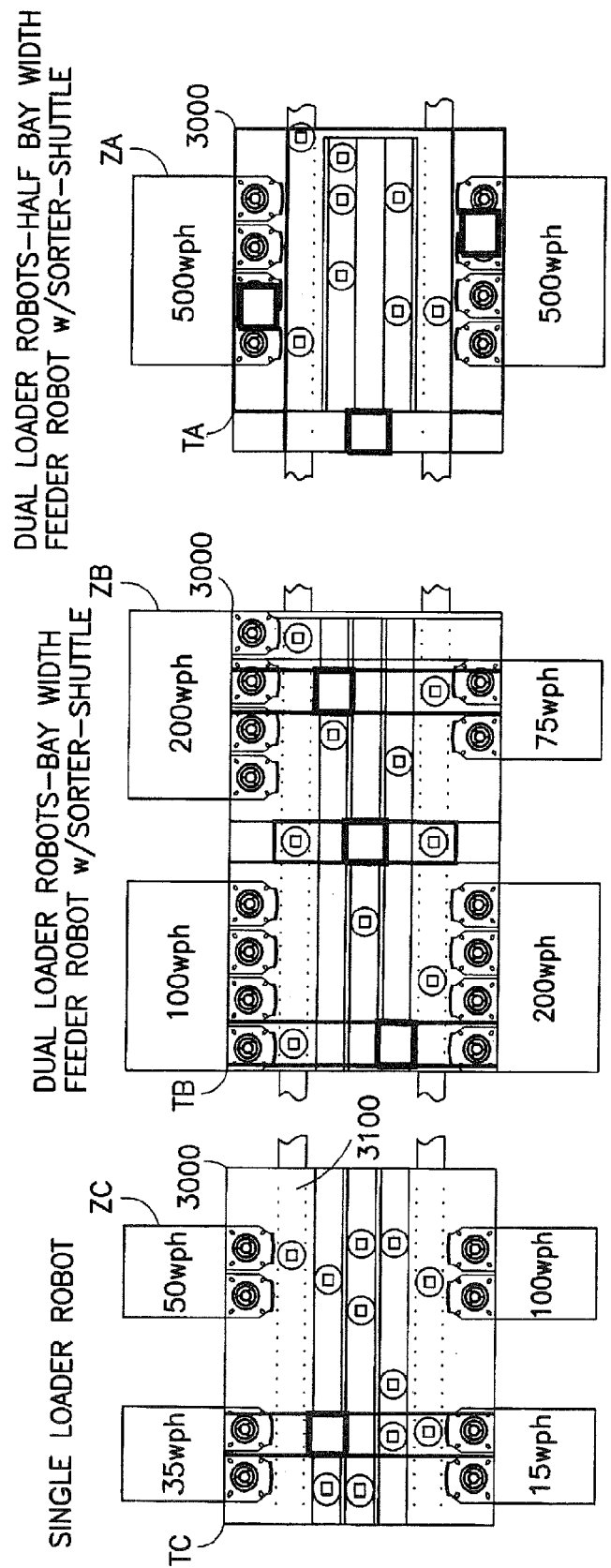

TRANSPORT SYSTEM

CROSS-REFERENCE TO RELATED APPLICATIONS

This application is a non-provisional of and claims the benefit of Provisional Patent Application No. 61/566,443 filed on Dec. 2, 2011.

BACKGROUND

1. Field

The exemplary embodiments described herein are related to substrate processing systems and particularly to substrate transport systems, transport carriers, transport to processing tool interfaces and arrangements.

2. Brief Description of Related Developments

The prime forces on the fabrication of electronic devices are the consumer desire for more capable, and smaller electronic devices at lower costs. The primal forces translate to an impetus on manufacturers for further miniaturization and improvements in fabrication efficiency. Manufacturers, thus seek gains wherever possible. In the case of semiconductor devices, the conventional fabrication facility or FAB has at its heart (or base organizational structure) the discrete processing tool, for example a cluster tool, for performing one or more processes to semiconductor substrates. Conventional FABs are hence organized around the processing tool, that may be arranged in desired configurations to transform the semiconductor substrates into desired electronic devices. For example, the processing tool may be arrayed in the conventional FAB in processing bays. As may be realized, between tools, substrates may be held in carriers, such as SMF's, FOUP's, so that between tools substrates in process may remain in substantially similar cleanliness conditions as within the tools. Communication between tools may be provided by handling systems (such as automated material handling systems, AMHS) capable of transporting substrate carriers to the desired processing tools in the FAB. Interface between the handling system and processing tool may be considered for example purposes as having generally two parts, interface between handling system and tool to load/unload carriers to the loading stations of the processing tool, and interface of the carriers (i.e. (individually or in groups) to the tool to allow loading and unloading or substrates between carrier and tool. There are numerous conventional interface systems known that interface the processing tools to carriers and to material handling systems. Many of the conventional interface systems suffer from complexity resulting in one or more of the process tool interface, the carrier interface or the material handling system interface having undesired features that increase costs, or otherwise introduce inefficiencies in the loading and unloading of substrates in processing tools.

It would be advantageous to provide a system in which the wafer carrier, the interface between the carrier and processing tool, the carrier transport system (transporting carriers between tools, storage locations, etc. within the FAB) be arranged to allow use of wafer lots as small as one and as large as desired, without adversely impacting FAB rate.

BRIEF DESCRIPTION OF THE DRAWINGS

The foregoing aspects and other features of the disclosed embodiments are explained in the following description, taken in connection with the accompanying drawings, wherein:

FIGS. 3-7 respectively are schematic views illustrating different selectable arrangements of the system in accordance with different exemplary embodiments;

DETAILED DESCRIPTION

Figure 1:
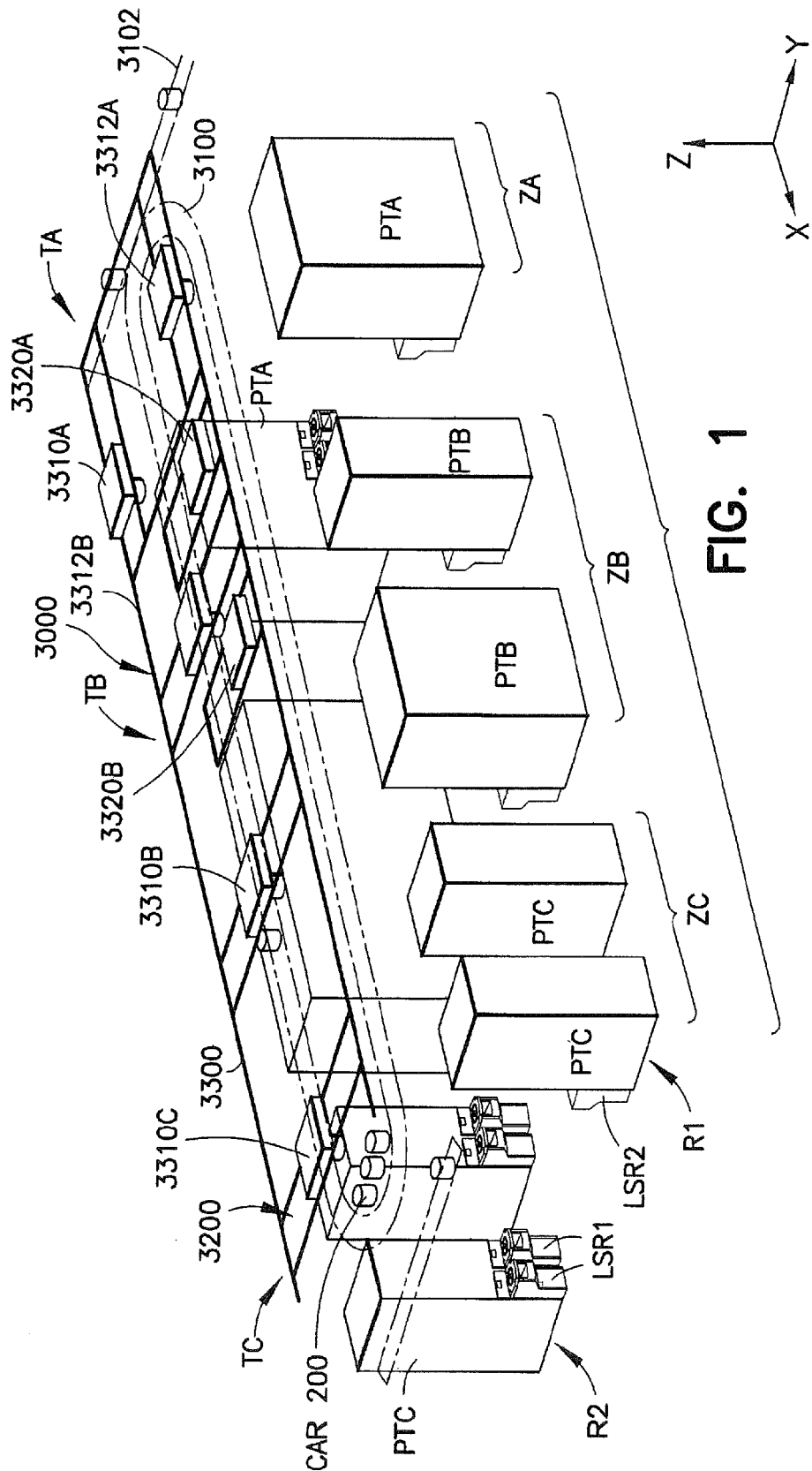
FIGS. 1 and 1A-1B are respectively a schematic perspective view, an end elevation view and a top plan view of a processing system in accordance with still another exemplary embodiment.
Figure 1A:
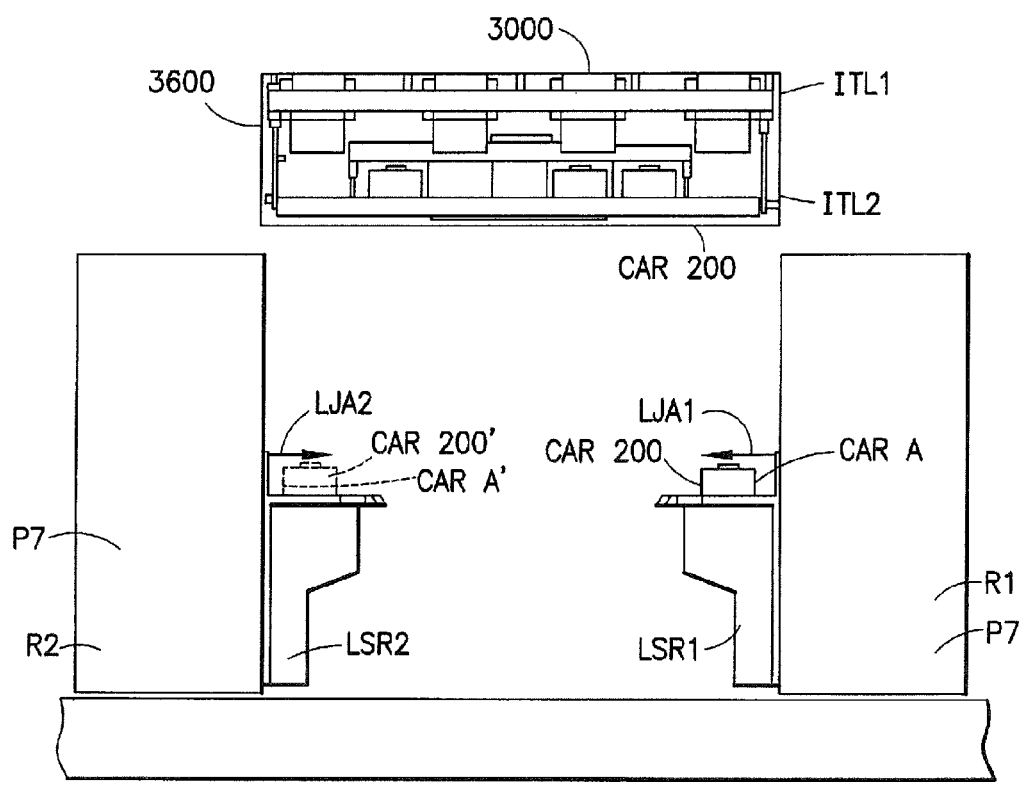
Figure 1B:
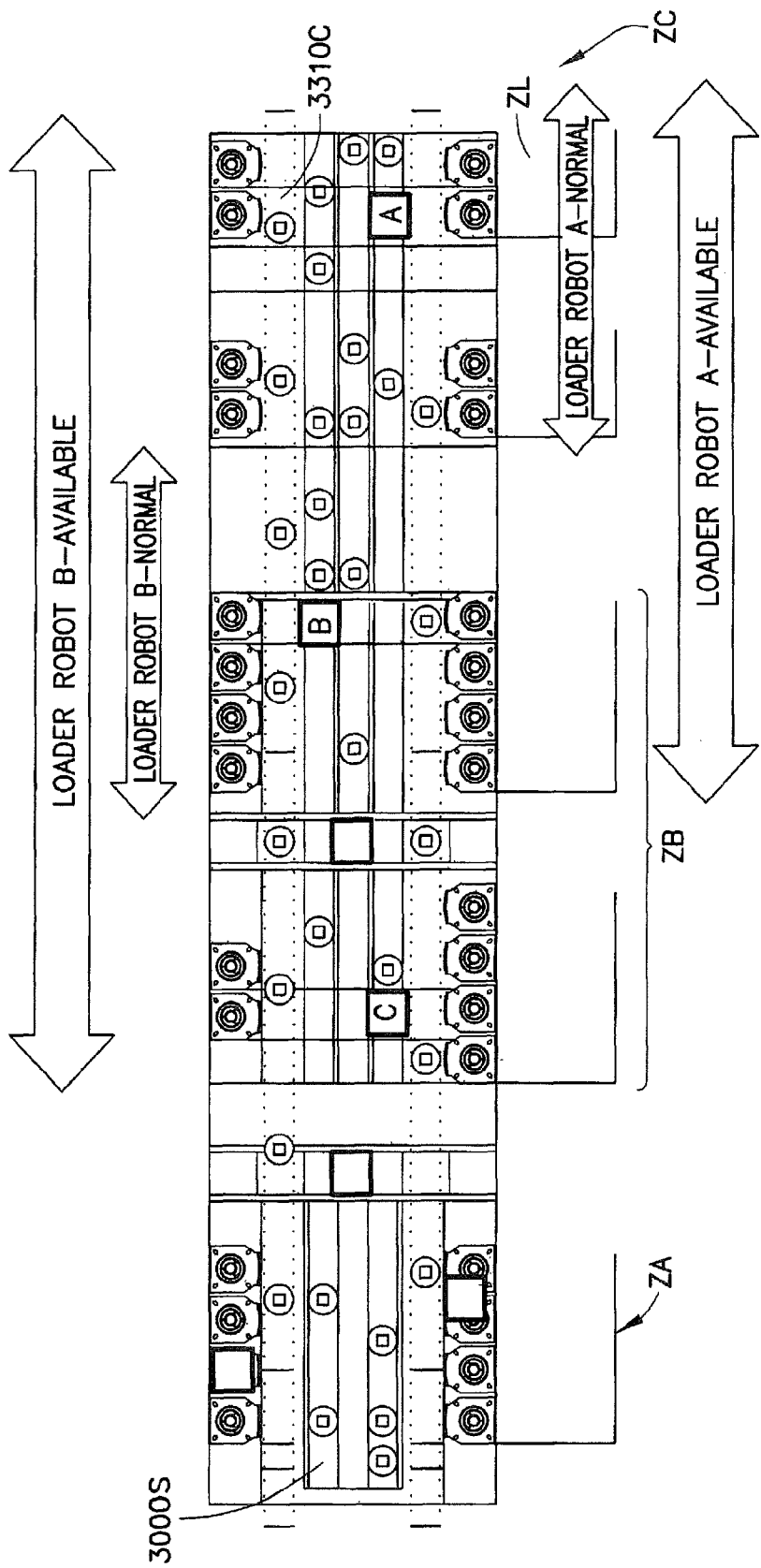

FIGS. 1-1B respectively illustrate a schematic perspective view, an end elevation view, and top plan view of a representative processing arrangement with processing tools PT and a transport system in accordance with an aspect of the disclosed embodiment. Although the aspects of the disclosed embodiment will be described with reference to the drawings, it should be understood that the aspects of the disclosed embodiment can be embodied in many alternate forms. In addition, any suitable size, shape or type of elements or materials could be used.

The processing tools PT are illustrated in an exemplary array such as tools arrayed in a processing bay of a FAB. The transport system 3000 in the exemplary embodiment may service the tools of the processing bay for example, the transport system 3000 may be an intra-bay portion of a FAB wide transport system. The transport system 3000 in the aspects of the disclosed embodiment may be generally similar to a section of the AMHS system exemplary embodiments described in U.S. patent application Ser. No. 11/891,835 filed Aug. 13, 2007, the disclosure of which is incorporated by reference herein in its entirety. The transport system 3000 may communicate with other (e.g. interbay) portions 3102 of a FAB AMHS system via suitable transport interfaces seen in FIG. 1. As noted before, the arrangement of the processing tools PT in the tool array shown is merely exemplary, with multiple tool rows (in the example two rows R1, R2 are shown, but alternate embodiments may have more or fewer tool rows). In the example shown, the tool rows may be arranged substantially parallel (geometrically, but may be angled relative to each other) and may define substantially parallel process directions. Process direction along different tool rows may be the same or opposite to each other. Also process direction along a given row may reverse so that the process direction along one portion or zone of the tool row may be in one way and the process direction of another portion or zone of the same tool row may be the opposite way. The process tools in row R1, R2 may be distributed to define different process zones ZA-ZC (see for example FIG. 1). Each process zone ZA-ZC may include one or more process tools in rows R1, R2. In alternate embodiments, a process zone may have tools located in but a single row. As may be realized, the process tools in a given zone may be process related, such as having complementing processes and/or having similar tool throughput rates. For example tool zone(s) ZA may have tools with a high throughput, (e.g. about 500 wafers per hour (WPH)), tools with medium throughput (e.g. roughly 75 WPH to less than 500 WPH) may be located in zone ZB, and tools with a low throughput (e.g. roughly 15 WPH to 100 WPH) may be located in zone ZC. As may be realized, the tools defining any given zone may not be identical, and one or more tools within a given zone may have a throughput or process that may be different than the other tools in the given zone, but a relationship may nevertheless exist between the tools in the zone so that it is organizationally appropriate, at least with respect to a transporting aspect, to have the tools organized within the same zone. The tool zones illustrated in FIG. 1 are merely exemplary, and in other aspects the tool zones may have any other desired arrangement.

Figure 6:
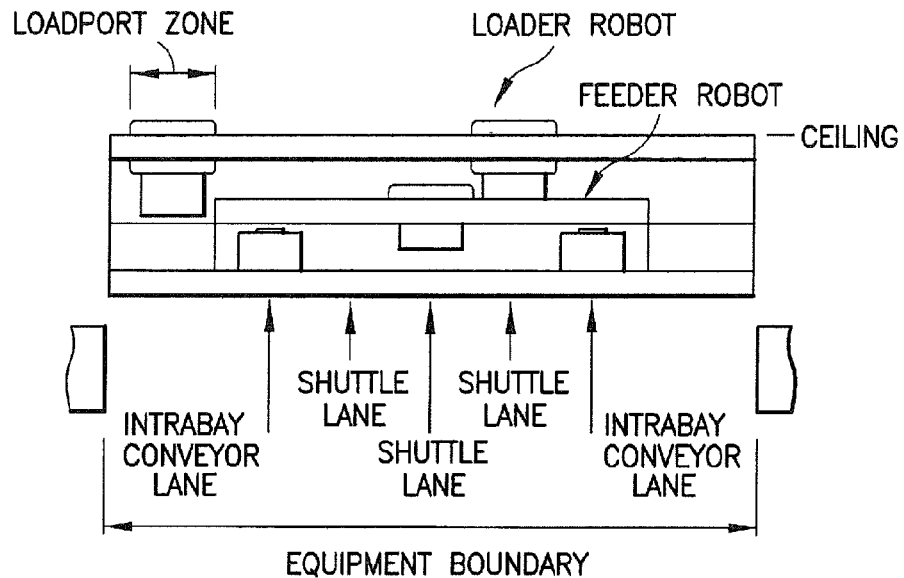

As seen in FIG. 1, the transport system 3000 is capable of transporting carriers to/from tools. The transport system 3000 may be generally similar to the transport system described in U.S. patent application Ser. No. 11/891,835 (previously incorporated by reference). In the aspects of the disclosed embodiment shown in FIGS. 1-1B, the transport system 3000 may have an overhead configuration (e.g. transport system is located above/over the tools). In other aspects, the transport system may have any other suitable configuration, such as having an underneath configuration (e.g. transport system is located underneath the tools). As seen in FIGS. 1-1B, the transport system may generally have a number of transportation sub-systems or sections. In the aspects of the disclosed embodiment, the transport system 3000 may generally have a bulk material/rapid transport section 3100, such as a conveyor section (e.g. similar to the solid-state conveyor described and shown in U.S. patent application Ser. No. 11/891,835 (previously incorporated by reference) or any other suitable conveyor). The conveyor section may extend through all tool zones, and may transport carriers, for example, at a substantially constant transport rate without stopping/slowing when carriers are placed/removed from the conveyor section. The transport system 3000 in the an aspects of the disclosed embodiment may also include storage stations/locations 3000S (see also FIG. 1B), shuttle system section 3200 with shuttles 3202 capable of accessing one or more storage stations/location (see also FIG. 2), and an interfacing transport system section 3300. In one aspect, the interfacing transport system section may be capable of accessing carriers transported by the bulk transport conveyor section 3100, or at the storage stations, and transferring the carrier to loading sections of the processing tools. In the an aspect of the disclosed embodiment, the storage stations, shuttle system section 3200 and interfacing transport system section may be formed in selectably installable portions capable of selectable installation along the transport system. In the aspects of the disclosed embodiment, the transport system sections 3100, 3300, 3200 may be modular for ease of installation of the portions of the system sections selected for installation in the transport system. The portions of the transport system shuttle system, interface system, and storage system sections selected for installation along the transport system may correspond to the zones ZA-ZC of the processing tool. As may be realized, the transport system 3000 may be configurable to correspond to the processing tools or processing tool zones. Moreover, in the aspects of the disclosed embodiment the transport system may be configurable in zones TA-TC, generally commensurate with and corresponding to the processing tool zones ZA-ZC. Thus, the transport system may have different zones with different system sections configurations. In the aspects of the disclosed embodiment, the storage system and shuttle system sections may be configurable in each zone TA-TC of the transport system. Also, in the aspects of the disclosed embodiment, the interface transport system section may be configurable in each zone. The interface transport system, in the exemplary embodiment may have selectably installable interface transporter (in the example shown in FIG. 1 gantry) portions 3310, 3320 that may be added, removed and may be installed in a number of different orientations in each transport system zone TA-TC. The desired interface transport system portion, may be installed in the transport system zones to provide a desired tool interface and access rate, for example commensurate with the throughput rate of the process tool of a corresponding tool zone ZA-ZC. As seen best in FIG. 1A, the interface transport system section may have a selectably variable number of transporter travel planes (e.g. some zones TC may have a single interface transporter travel plane, see FIG. 8, and other zones TA, TB may have more than one transporter travel plane ITC1, ITC2, (see FIGS. 1A, 6). In the zones with multiple planes, transporters may be capable of traversing past one another. Though two planes are shown, more or fewer transporter planes may be provided. Although in the aspects of the disclosed embodiment the transport system is arranged with the travel planes substantially horizontally, in other aspects the transport system may have any other desired arrangement including having vertical travel planes for interface transporter bypass.

The Overhead Gantry System (OGS) can be configured for low, medium, or high throughput. Changing factor or process capability can be met through field reconfigurable modular assemblies. These modular assemblies can be broken for example into three categories; low throughput, medium throughput, and high throughput. Arrangement of the various modules may be dependent upon many factors such as desired move rate, storage capacity, and distribution of the desired throughput in a bay.

Low Throughput: By way of example, low throughput tools or tool zones can be sufficiently accommodated with a single gantry 3310. This configuration may provide all the desired moves without the use of a "feeder" robot 3320 or a shuttling system 3200. The gantry may pick carriers from the intrabay conveyor and transfer to a storage location in addition to transferring carriers from storage to the tool. In order for carriers to be moved to an adjacent gantry zone, the carrier may be placed on the intrabay conveyor or placed in a storage nest for retrieval by the adjacent gantry. With this configuration one gantry to cross past another gantry until the intervening gantry has moved. In situations where two or more gantries are working side by side one fails, the adjacent gantry can take on the work of the failed unit. Although the work capacity will decrease, it will not be shut down completely.

Figure 7:
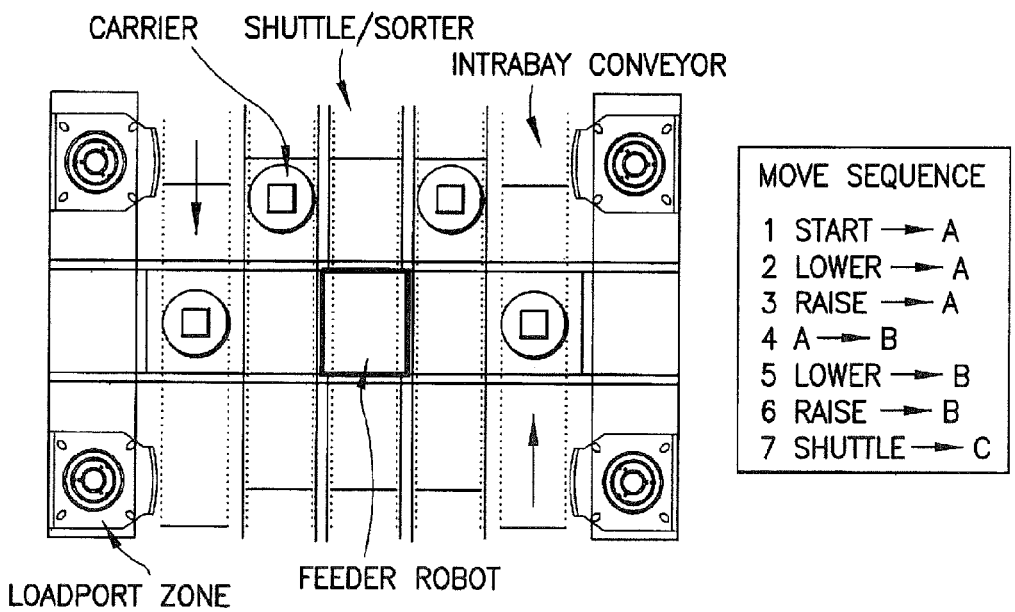

Medium Throughput: For example, a medium throughput tool or tool zone can be satisfied with the addition of a "feeder" robot 3320 (e.g. an additional gantry/transporter level). This configuration is generally similar to the low throughput arrangement with the addition of a feeder robot 3320 and sorter/shuttle 33200. In the exemplary embodiment, the feeder robot and sorter/shuttle may be dedicated device for executing intrabay conveyor to storage moves only. For every feeder robot it may be desired to employ two gantry loader robots 3310, 3312 on either side (see FIG. 4) of the feeder. However, in other aspects, the feeder may be paired with one loader robot. The sorter/shuttle's purpose is to accept the carrier from the feeder and queue it for storage. With this configuration the "loader" robot can focus on storage to tool moves and vice versa without the added burden of picking carriers from the intrabay conveyor. The system can work with adjacent low, medium, or high throughput modules. In the event of a loader robot failure it is possible for an adjacent loader robot to move in and work the failed robot's zone. (see FIGS. 6 and 7). If a feeder mechanism was to fail, the individual loader robots behave in the same manner as the low throughput configuration. In both failure cases the system remains active but at a reduced capacity.

High Throughput: By way of example, for high throughput applications the gantry modules can be reconfigured to meet the demand of the specific tool or tool zone. The high throughput arrangement may have a loader robot on each side of the bay, a similar feeder robot arrangement as in the medium throughput zone, and a similar sorter/shuttle for queuing the carriers to storage. (see FIG. 5). The loader robot is responsible for the tool located on one side of the bay, which allows for shorter moves. Carriers enter and exit the high throughput zone via the intrabay conveyor system. The high throughput configuration has fault tolerance to both a loader robot failing and/or the feeder robot failing. If a loader robot was to fail the other loader robot may work both sides of the bay after the failed robot is moved out of the zone. If the feeder fails the loader robots become responsible for picking carriers from the intrabay conveyor system. If both a loader robot and a feeder robot fail, one loader robot becomes accountable for all desired moves.

Figure 10:
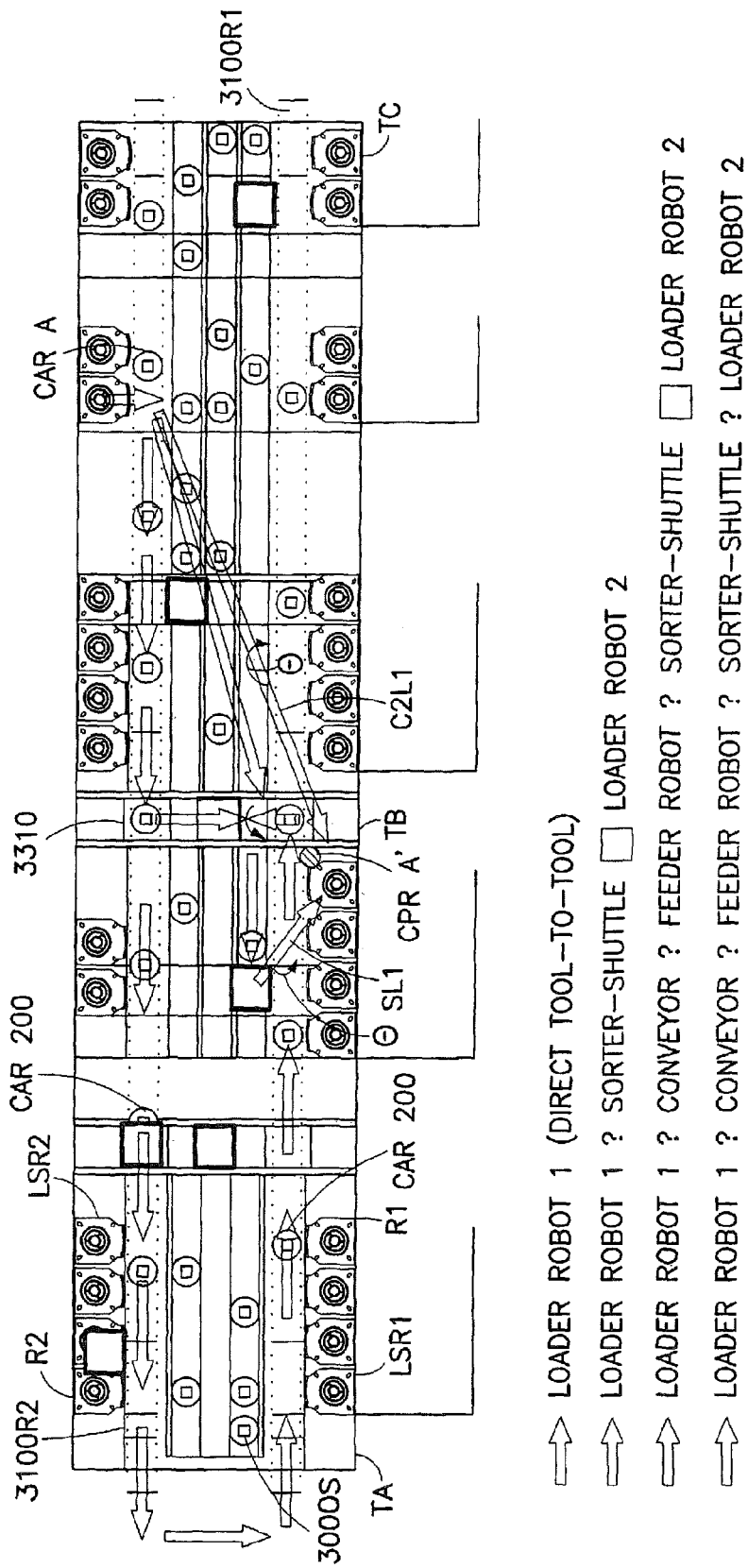
FIG. 10 is another schematic plan view of a processing system in accordance with another exemplary embodiment.

Each configuration; low, medium, and high can operate as a single entity or adjacent to any of the three arrangements depending on the desired move rate. The system does not have any single point failures that completely incapacitate the flow of carriers through the system. In addition to fault tolerance for individual or multiple component failures, the system can exploit multiple available move paths for a carrier. The host controller employs a standard set of moves with successive levels of priority moves for a particular carrier under normal operating conditions. To overcome periodic surges in carrier traffic, tool failures, or upstream restrictions, a host's control logic can initiate schemes to reroute and divert carrier flow away from problem areas. FIG. 10 demonstrates the many methods to move a carrier from point A to B in accordance with the exemplary embodiment.

In the aspects of the disclosed embodiment the "feeder" robot may retrieve carriers from the intrabay conveyor system and place them in the appropriate storage location. If desired the feeder robot allows the tool loading robot to focus solely on storage to tool moves and increases the systems total move capacity. The feeder utilizes quick short moves allowing the intrabay conveyors to move with limited or no interruption. The feeder mechanism relieves the workload of a gantry system. Anticipated drive mechanisms to support the various motions include linear motors, ball screws, pneumatic drives, belt drives, friction drives, and magnetic propulsion. The following aspects can be implemented based on the previously described premise:

The feeder robot is similar to the gantry loading robot except it is fixed in the x direction (length of the bay) and has degrees of freedom in the y (transverse to bay) and Z (vertical) directions. The feeder mechanism is located on a plane below the tool loading robot to allow the loader robot to pass over without a payload. The area above the load port zones is free to allow the loader robot to move across the feeder with a payload. The feeder system is vertically located such that when the vehicle is in the raised position it can pass over the intrabay conveyor and have enough space to move over and grasp a carrier. The feeder accesses carriers from above, utilizing short vertical strokes to pick and place carriers from the intrabay conveyor system to the storage flange desired. In this configuration the storage lanes exist coplanar to the intrabay conveyors. The storage lanes possess a bi-directional sorter/shuttle mechanism used to shuttle a carrier to the next location along the storage row. The shuttle drive mechanism is designed for example such that it can move a carrier at least one pitch distance along the length of the bay. A pitch distance can be defined as the distance that allows the gantry tool loading robot to travel adjacent to the feeder robot and pick the carrier without interference. The sorter/shuttle is also used to transport carriers between adjacent loader robot zones and storage lanes when desired. For example, a carrier move sequence is as follows:

Intrabay conveyor momentarily stops at feeder robot's fixed X position along the bay length.

Feeder robot travels from previous Y position to location directly above carrier on intrabay conveyor.

Feeder robot picks carrier.

Feeder robot travels in Y direction (transverse to bay) to specific shuttle lane.

Feeder robot places carrier onto shuttle and proceeds to next move.

Shuttle/sorter mechanism drives carrier in X direction.

Gantry tool loading robot moves to storage location, then picks and places carrier to the appropriate tool.

Examples of some of the advances of the system in accordance with the aspects of the disclosed embodiment are increased wafer throughput over conventional systems, multiple move paths to complete carrier moves, and increased fault tolerance.

Figure 8:
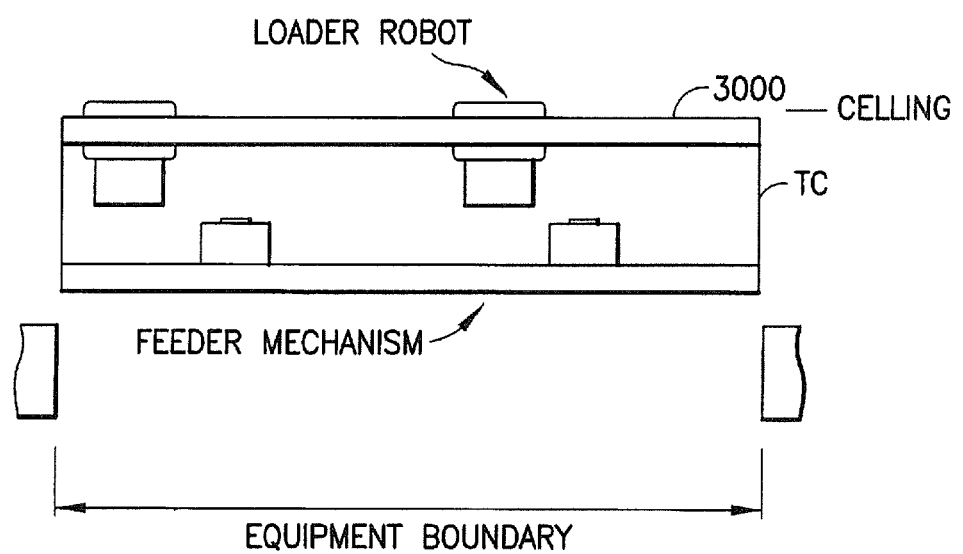
FIG. 8 is a schematic elevation view of the system in accordance with still another exemplary embodiment.

In accordance with another aspect of the disclosed embodiment shown in FIG. 8, the feeder robot is implemented as a linear stage that resides on a plane just below the shuttle and intrabay conveyor system. The stage has the same degrees of freedom as embodiment 1 and grips the carrier from below rather than above. Once the carrier is captured from the intrabay conveyor it is driven transverse to the bay and release on the appropriate shuttle. This architecture has the benefit of allowing the conveyor lanes to be positioned anywhere between the equipment boundary. For example, the intrabay conveyors could exist in the center rather than the outside as described above. Another advantage with this arrangement is the loader robot can now pass over the feeder mechanism with payload in any Y position in the bay whereas with the aspect described above the loader is limited to performing this move only when it is located inside the load port zone. Furthermore, there is no need for the loader robot to communicate with the feeder geometry for collision avoidance. Both the feeder and loader robots can occupy the same vertical space with payloads and not interface with one another. The move sequence for this configuration is the same as that described above with the exception of grasping carriers from below rather than above.

Figure 9:
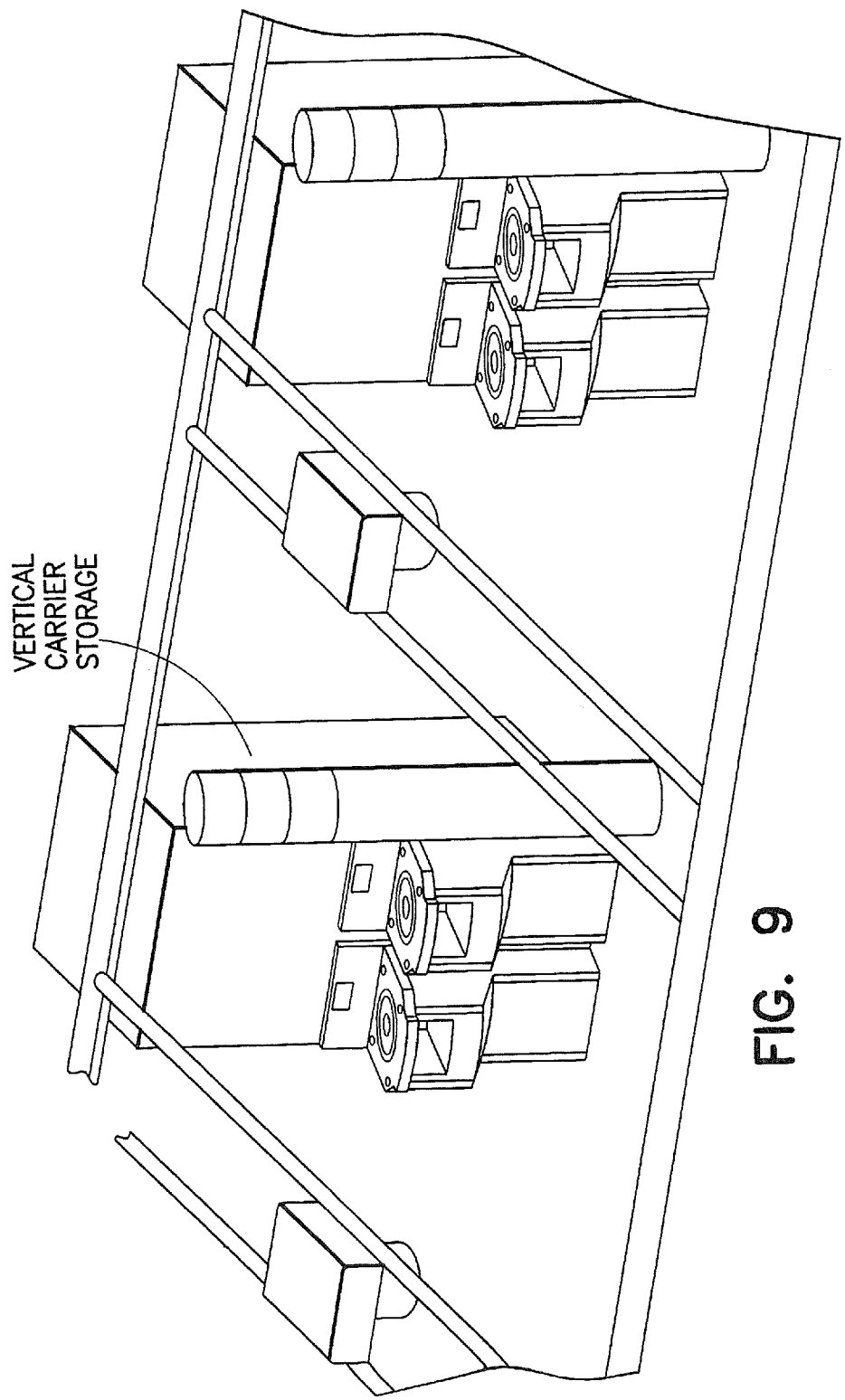
FIG. 9 is a schematic a partial perspective view of the system in accordance with yet another exemplary embodiment.

In other aspects, the overhead or mechanism from below can move in the X (length of bay), Y (transverse to bay), and Z (vertical) directions. In this configuration a shuttle/sorter may not be used because the 3 axis feeder can move to the specific storage lane and slot as necessary. For example, a carrier is removed from the intrabay conveyor, positioned to the appropriate storage lane then translated perpendicularly to the initial queuing the carrier in storage. As seen best in FIG. 9, in accordance with another aspect of the disclosed embodiment, increased storage capacity may be generated by providing vertical storage columns that allow for carrier storage in a volume consistent with the carrier geometry that extends from the FAB floor to the highest reachable point by the OHT system can be arranged throughout the length of the bay.

As may be realized, in the aspects of the disclosed embodiment, such as illustrated in FIG. 1, the interface or loading and unloading stations of process tools PT served by transport system 3000 may have different facings relative to each other. The facing of a loading station and/or process tool as described hereafter may not specifically refer to the position or orientation of any side or face of the loading station or process tool, but rather refers to the characteristics (whatever they may be) of the loading station or process tool that specify a predetermined orientation of the loading station and/or process tool relative to the carriers mated to the loading station and/or wafers loaded from the carriers into the process tool. Carriers, transported by transport system 3000 to and from the process tools PT, when mated to the loading stations of different tools, with different facings, may be mated in different orientations corresponding to the facing of the respective loading stations. Hence carriers mated to loading stations of different process tools, served by transport system 3000, may have different orientations relative to each other. The seating interface mating carriers to the loading stations(s) of process tools may be polarized to permit mating with the carrier in the desired orientation, for example corresponding to the facing of the loading station. Carriers (similar to those described in U.S. patent application Ser. No. 11/891,835 (previously incorporated by reference)) may not have an isomorphic configuration with respect to mating to the loading station(s) of process tools PT. By way of example, the carriers may have a casing or housing, that may be generally isomorphic in appearance or shape, but may be loaded with substrate(s) in a desired orientation relative to the reference frame of the process tool(s). Thus, when mated to the loading station(s) of the process tool(s) PT the carriers may be loaded so that the substrate(s) therein are in the desired orientation specified for the processing tool. In other aspects, the carrier casing may have a non-isomorphic shape (e.g. the carrier may be similar to a FOUP, having a casing such as with a substrate transfer opening in but one desired side or face of the casing) defining a desired orientation for mating the carrier to the loading station of the process tools. In the aspects of the disclosed embodiment, the carrier(s) CAR 200 may have suitable discriminators or indicia (for example structural or electronic) to indicate orientation of the carrier. As may be realized, the control system (not shown) of the transport system 3000 may be suitable configured or programmed to identify and/or track the orientation of the carrier(s) CAR 200 from the discriminators or indicia of the carriers as the carrier of the transported between tools PT, throughout the FAB by transport system 3000. The control system may also be configured or programmed to relate the orientation of the carrier(s) CAR 200 to the facing of the loading stations so that carriers may be loaded and mated by transport system 3000, to the loading station(s) in an orientation corresponding to the given facing of the loading station. In the aspects of the disclosed embodiment illustrated in FIGS. 1 and 10, the transport system 3000 may include, what may be referred to for description purposes, as a θ drive system 3600 arranged to provide independent θ motion (e.g. rotation of the carrier, such as indicated in FIG. 1A, to change carrier orientation) to the transported carriers. Drive system 3600 of the transport system 3000 may effect θ motion or rotation of the carriers independent of carrier movement in any other direction (such as in the x, y, z directions see FIG. 1) as will be described further below. Thus, transport system 3000 in the exemplary embodiment may be capable of four degrees of freedom movement (x, y, z, θ) for transporting carriers to and from process tools. In alternate embodiments, the transport system may have carrier transport movement with more or fewer degrees of freedom. In the exemplary embodiment, the θ drive system 3600 may be arranged to effect independent θ motion of the carrier with the carrier "on the fly" as will also be described further below.

As has been noted before, the process tools PT may have loading stations LSR1, LSR2 with different facings, relative to each other, that may cause the carriers to be placed on the loading stations, by transport system 3000, in different loading orientations (corresponding to the facing of the loading stations). Referring again to FIGS. 1 and 10, in the aspects of the disclosed embodiment illustrated, the process tools PT served by transport system 3000, may be arranged in rows R1, R2 (though as has also been noted before, in other aspects, the process tools, and their corresponding loading stations may be located in any desired arrangement that may or may not use rows or columns and may have any desired array or serial arrangement). As seen best in FIG. 1A, in one aspect the process tools PT in the respective rows R1, R2 may be positioned so that the corresponding loading stations LSR1, LSR2 of the process tools may be generally facing each other. Accordingly, as may be realized from FIG. 1A, the loading stations LSR1 or process tools in row R1, may be facing in a direction (indicated by arrow LSA1 in FIG. 1A) that may be substantially opposite (e.g. about 180° apart) than the facing direction (indicated by arrow LSR2) of the loading stations LSR2 in row R2. The facing directions of loading station may be similar in each row (e.g. loading stations LSR1, LSR2 in corresponding tool rows R1, R2 may generally be facing in directions LSR1, LSR2 respectively), though in other aspects, one or more tools in one or more rows may have loading stations with a different facing than other loading station(s) of tools in the same tool row. In other aspects, the loading stations may be facing in different directions more or less than 180° apart. In still other aspects, the loading stations of tools served by the transport system may have a similar facing direction. FIG. 1A shows, for example purposes, CAR 200 mated to loading station LSR1. The carrier CAR 200 on the loading station LSR1, in the aspect shown, may be oriented (as indicated by orientation features CAR A, depicted schematically for example purposes) to correspond to the facing (indicated by arrow LSA1) of the loading stations LSR1. FIG. 1A also shows the carrier CAR 200' (indicated in phantom) when mated to loading station(s) LSR2 oriented (as indicated by feature CAR A') to correspond to the facing (indicated by arrow LSR2) of loading station LSR2. As may be realized from FIG. 1A, in the aspects of the disclosed embodiment the orientation of carriers CAR 200 mated to loading station(s) LSR2 may be about 180° from the orientation of carriers when mated to loading station(s) LSR1. In other aspects, the difference in the orientation of carriers mated to loading stations with different facings may be more or less than 180°. In the aspects of the disclosed embodiment, transport system 3000, for example using θ drive system 3600 is capable of rotating the carrier CAR 200 (such as θ rotation) to orient the carrier to the desired orientation CAR A, CAR A' for mating the carrier with the desired loading station. As may be realized from FIG. 1A, the θ drive system 3600 of the transport system 3000 may be capable of effecting θ rotation of the carrier of about 180° and, in one aspect θ rotation of the carrier CAR 200 by the θ drive system 3600 may be about 270° as will be described further below. In other aspects, the θ drive system may be capable of effecting θ rotation of the carrier in any desired amount.

Figure 2:
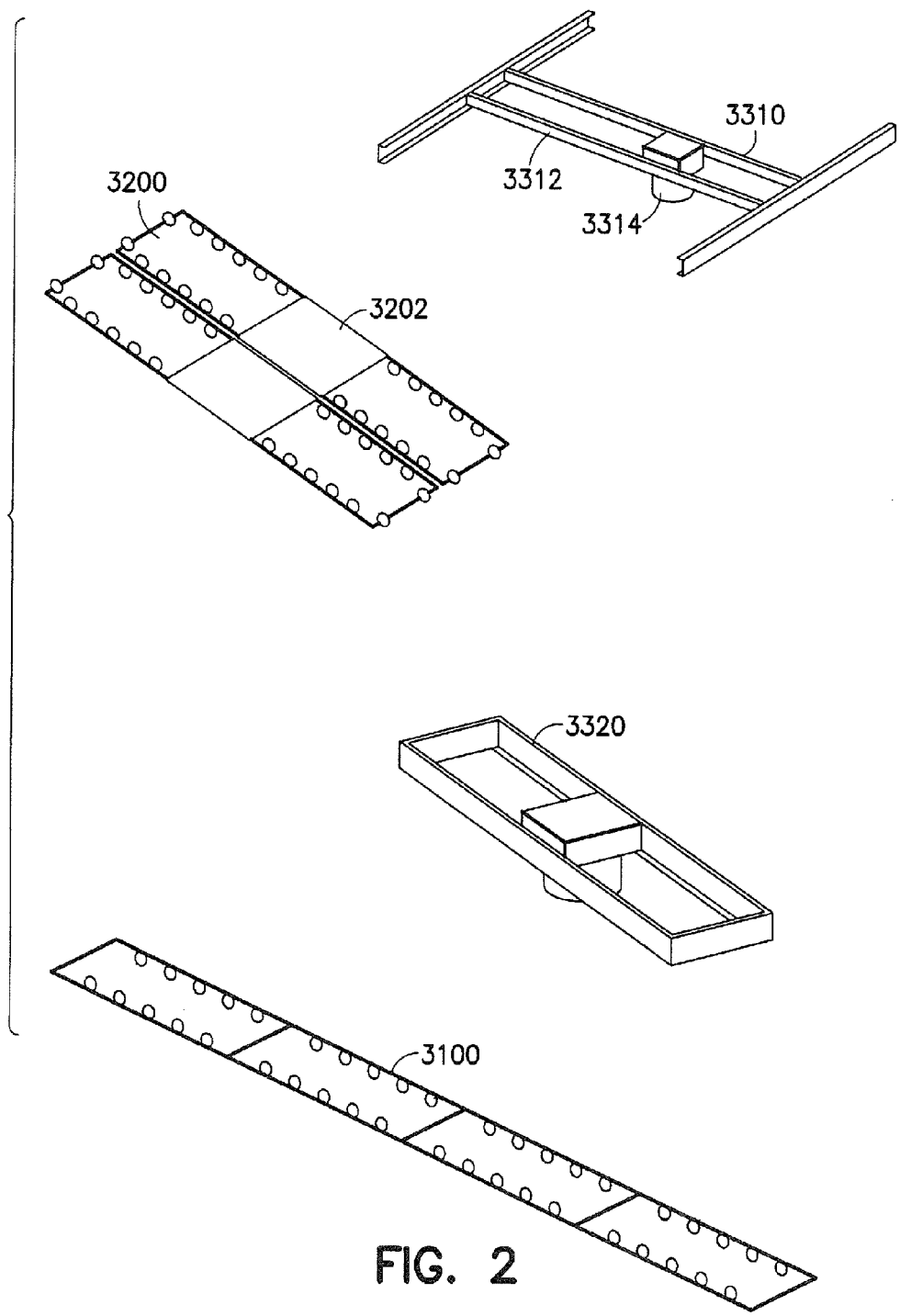
FIG. 2 is a schematic exploded perspective view of sections of the system in FIG. 1.

Referring still to FIG. 1, in the aspects of the disclosed embodiment, the transport system 3000, as described before, may generally comprise rapid transport section 3100 (such as a conveyor or other suitable mass or bulk material transport without or with discrete transport vehicles) and an interface transport system section 3300 (interfacing carriers between the rapid transport section and tool loading stations so that transport section 3100 can, when operative, maintain substantially continuously a substantial constant transport rate independent of loading and unloading of the container to the loading stations). In FIG. 2, the interface transport section 3300 is illustrated as having an overhead gantry 3310 configuration for example purposes, and in other aspects, the interface transport section may have any other suitable configuration. In the aspects of the disclosed embodiment shown in FIG. 2 the gantry(ies) 3310 (the interface transport system may be modularly configured with a desired number of gantries) may generally comprise a translation platform 3312 with traverser 3314 arranged to provide two axis travel (e.g. x, y axes, see also FIG. 1). The traverser 3314 may have any suitable configuration and may include a hoist device so that the carrier grip of the gantry, for capturing and holding carrier(s) CAR 200, may be for example raised and lowered, thus effecting Z axis travel. A suitable example of a traverser vehicle may be the Aeroloader™ transport vehicle available from Brooks Automation, Inc. As was noted before, the gantry 3310 may be arranged (see also FIGS. 3-5) to pick or place carriers off or on the conveyor section 3100 and to pick and place carriers onto the loading station(s) of the process tools. In the aspects of the disclosed embodiment, storage stations 3000S may also be provided (see for example FIG. 1B), and the interface transport section (e.g. gantry 3310) may access containers on any of the transport conveyor sections 3100, or at the storage stations 3000S or at the loading stations of the process tools, and may move the carriers CAR 200 therebetween in any desired sequence as has been described before. As noted before, FIG. 10 illustrates representative examples of some carrier moves, such as between any of the conveyor section 3100R1, 3100R2 and any loading station LSR1, LSR2 in either tool row R1, R2, or between any two loading stations LSR1, LSR2 in the same or different tool rows, or between any loading station LSR1, LSR2 and storage stations 3000S, that may be effected by the gantry 3310 of the interface transport section 3300.

Figure 2A:
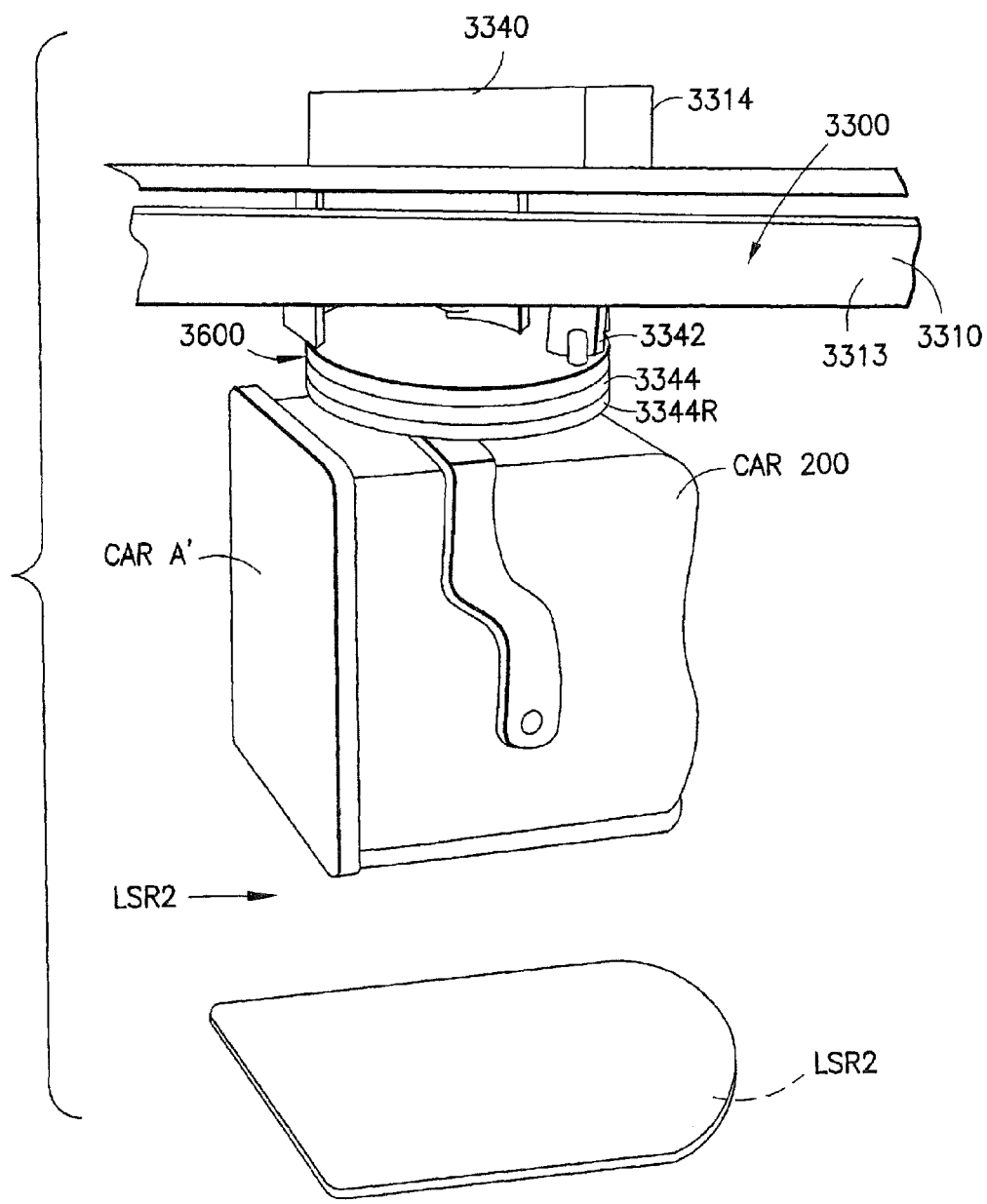
FIGS. 2A-2B are respectively schematic partial perspective views of another section of the transport system in FIG. 1 and carrier in different positions.

In the aspects of the disclosed embodiment, the gantry 3310 may include the θ drive system 3600 as described herein. As seen in FIG. 10, in one aspect the carrier CAR 200 may be rotated (as indicated by arrow θ) such as during transport by the interface transport section 3300, to change carrier orientation as desired. By way of example, when being conveyed by the conveyor sections 3100R1, 3100R2, the carrier(s) CAR 200 may have any orientation. In other words, the orientation of the carrier(s) CAR 200 on the conveyor transport may be different than the orientation in which the carrier is positioned at the loading station LSR1, LSR2. For example, the carrier CAR 200 may be positioned on conveyor transport 3100R2 in an orientation (indicated by feature CAR A shown in FIG. 10) that may be about 270° (clockwise) from the desired orientation (indicated by feature CAR A') of the carrier when mated to its destination loading station. The carrier CAR 200 may be moved by the gantry(ies) 3310 of the interface transport section 3300 from the conveyor 3100R2 to the desired loading station LSR1, generally as indicated by arrow C2L1 in FIG. 10. In the aspects of the disclosed embodiment, orientation of the carrier may be changed by the transport section during the move (e.g. θ rotation of about 270° clockwise) from the initial orientation (indicated by feature CAR A), on the conveyor, to the desired loading orientation (indicated by feature CAR A') for mating the carrier CAR 200 to the loading station LSR1. FIG. 2A is a partial schematic perspective view of gantry 3310 of the interface transport section 3300 in an exemplary position with the carrier CAR 200 held by the traverser 3314 in proximity to a representative loading station LSR2. The carrier CAR 200 is shown hoisted, by the gantry proximate to the loading station LSR2 and oriented to correspond to the facing of the loading station. The position shown may be representative of positions prior to mating or after un-mating the carrier from the loading station. As may be realized, the carriers transported by the transport system 3000, such as along move paths shown in FIG. 10, (e.g. move path C2L1) for loading and unloading loading stations LSR1, LSR2 may be positioned by the gantry 3310 as shown in FIG. 2A. In the aspects of the disclosed embodiment, the θ rotation of the carrier CAR 200 to change orientation, such as to allow mating with the load station, may be effected "on the fly" as the gantry is moving the carrier to the loading station. The θ rotation of the carrier may be effected at any desired time during the carrier move by the gantry. In other aspects, the θ rotation of the carrier may not be performed "on the fly". In the aspects of the disclosed embodiment, the gantry may unload the carrier from the loading station LSR1, LSR2 and move the carrier to the desired conveyor 3100R1, 3100R2 and may change the orientation of the carrier, by θ rotation during the move. For example, the carrier may be rotated to preposition the carrier in a desired orientation, such as an orientation corresponding to its next expected destination or loading station (both the next expected destination and its corresponding carrier orientation may be identified by the transport system controller). As noted before, carriers CAR 200 when moved between conveyor transports 3100R1, 3100R2 and loading stations LSR1, LSR2 or between loading stations in the same or different tool rows R1, R2 may be stationed, at least temporarily at one or more carrier storage stations 3000S. The orientation of the carriers when positioned in the storage station(s) may also be different from desired carrier orientation when mated to the loading stations. For example, the carrier when placed into the storage station 3000S, such as by interface transport section 3300 (e.g. gantry 3310 or feeder robot 3320, see also FIGS. 2, 4) may have an orientation corresponding to some prior criteria (e.g. may be in an orientation corresponding to the loading station the carrier was last unloaded from). This orientation may be different than that corresponding to the next loading station to which the carrier is to be mated. Accordingly, in the aspects of the disclosed embodiment the gantry may effect θ rotation of the carrier to change its orientation as desired when moving the carrier from the storage station 3000S to the loading station (such as along the path indicated by arrow SL1 in FIG. 10). The θ rotation of the carrier may be performed "on the fly" similar to that described previously. The carrier may also be placed by the gantry into a storage station 3000S in the desired orientation for subsequent interface. For example, in a manner similar to that described before, when unloading a carrier from a loading station. The gantry may change may change the orientation of the carrier, by θ rotation, when moving the carrier from the loading station to a storage station. In the exemplary embodiment, the gantry may also rotate the carrier to pre-orient the carrier, when moving the carrier from conveyor transports to storage stations. In the aspects of the disclosed embodiment, the gantry 3310 positioned to effect transport of carriers to the loading stations LSR1, LSR2 of the different rows R1, R2, may move the carriers from loading stations of one row R1, R2 to loading stations of the other row R1, R2 (in one move or a series of moves) and may change the carrier orientation (from an initial orientation corresponding to the loading station from which the carrier is removed to a final orientation corresponding to the destination loading station) by θ rotation during the move.

Figure 2B:
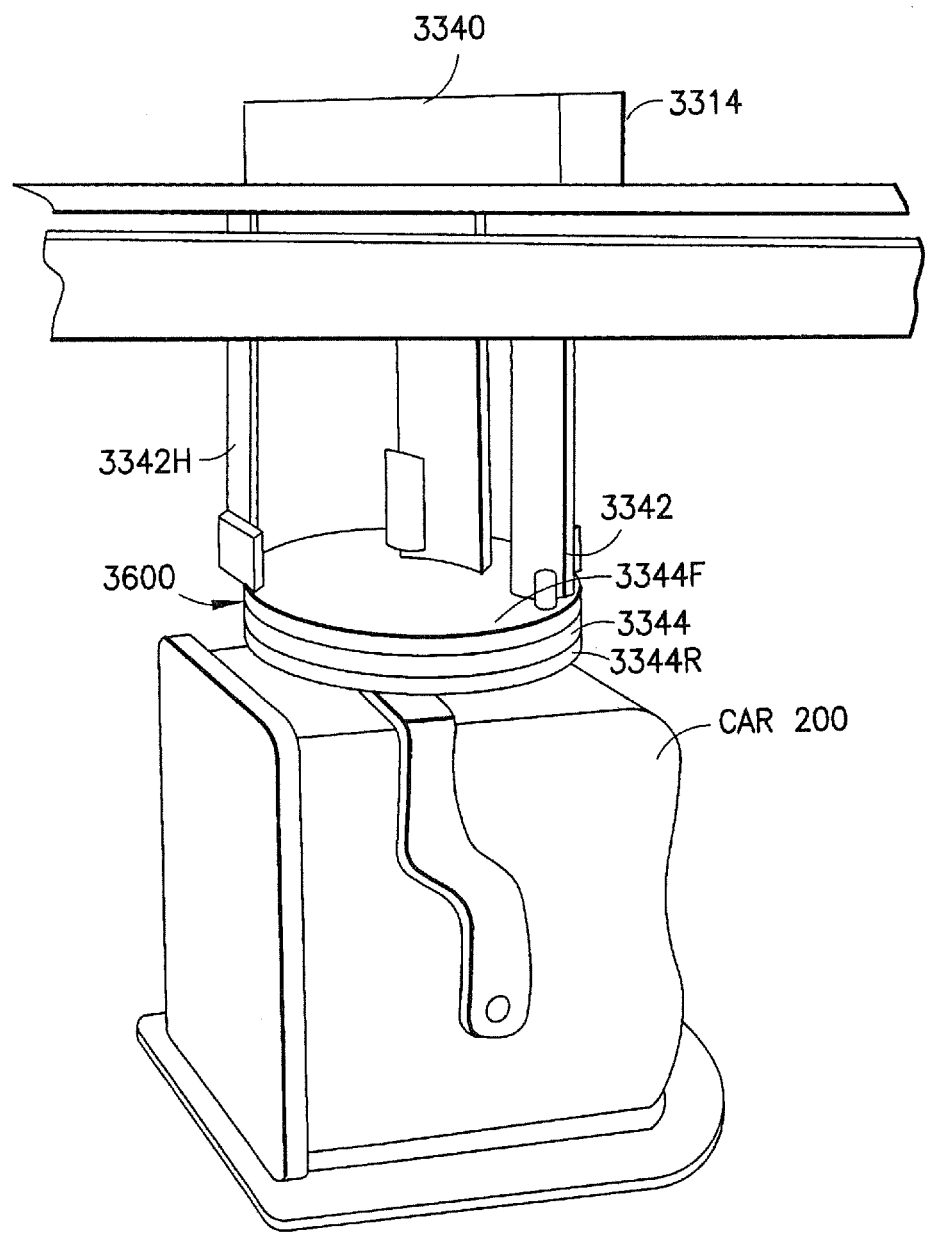
Figure 2C:
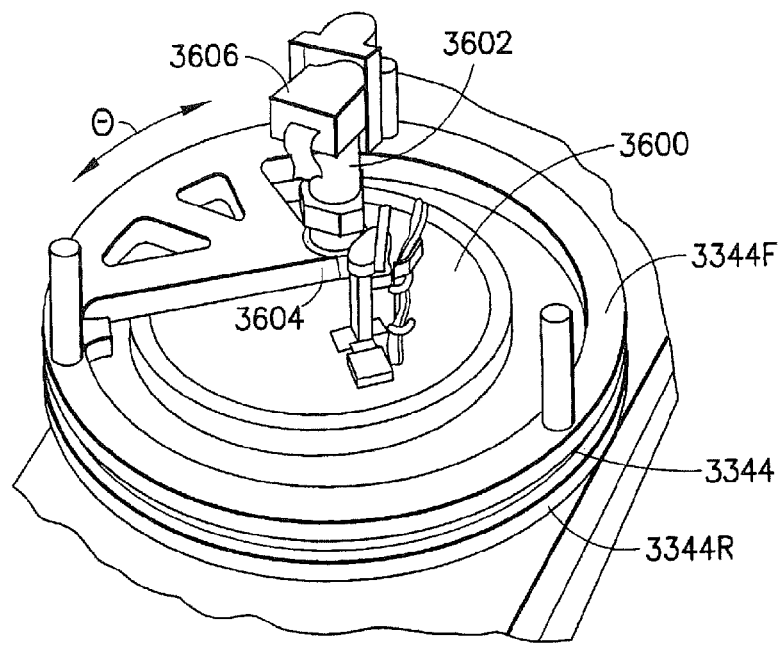
FIGS. 2C-2D are respectively schematic perspective and top plan views of a carrier gripper section of the transport system in FIG. 1.
Figure 2D:
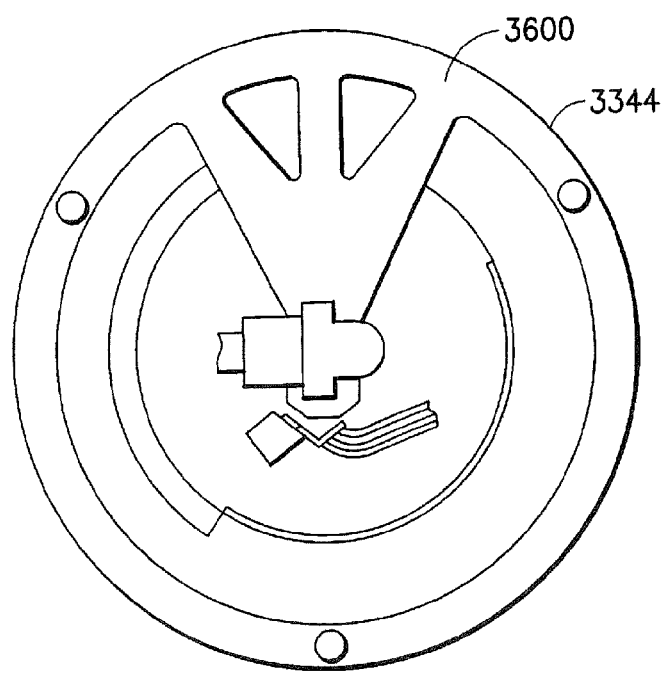

Referring now also to FIGS. 2B-2D, in the aspects of the disclosed embodiment the θ drive system 3600 of the gantry 3310 may be included in the traverser vehicle 3314. The configuration of the θ drive system shown in the figures and described below is merely exemplary, and in other aspects, the θ drive system may have any other suitable configuration. In the aspects of the disclosed embodiment, the traverser vehicle 3314 may generally have a base vehicle section 3340, a hoist mechanism 3342 and a carrier gripper section 3344. The base vehicle section 3340, in the aspects of the disclosed embodiment, is movably supported on the translation platform of the gantry (see FIG. 2). The hoist mechanism 3342 attaches the carrier gripper section 3344 to the base vehicle section 3340. The hoist mechanism 3342 may be raised and lowered in order to raise and lower the carrier gripper section relative to the base vehicle section. The carrier gripper section may be configured to interface with and grip and release the carrier. Referring now to FIGS. 2C-2D, there is respectively shown a schematic perspective view and top plan view of the carrier gripper section 3344. In the aspects of the disclosed embodiment, the θ drive system 3600 may be included in carrier gripper section 3344. In alternate embodiments, the θ drive system may be incorporated into the gantry traverser in any other desired manner. In one aspect, the carrier gripper section 3344 may include upper and lower parts 3344F, 3344R that are pivotally joined (such as rotary shaft) to each other to allow relative rotation between parts (in the direction indicated in by arrow θ in FIG. 2C). In the aspects of the disclosed embodiment, the upper part 3344F may be joined to the hoist bands or members 3342H (see FIG. 2B). The lower part 3344R may have the carrier gripper mechanism to engage the carrier. As may be realized, when gripped by the gripping mechanism the carrier may be locked relative to the lower part 3344R of the traverser carrier gripper section. In the aspects of the disclosed embodiment shown in FIGS. 2B-2D, the θ drive system 3600 may generally comprise a motor 3602 (such as a suitable servo or stepper motor), a shaft 3604 and an encoder 3606. The motor 3602 may have a stator fixed to the upper part 3344F of the carrier gripper section, and the rotor mounted on shaft 3604. The shaft 3602 may be fixed to the lower part 3344R of the carrier gripper section. Hence, the motor may be capable of rotating the lower part 3344R, and hence the carrier gripped by the carrier gripper. The encoder 360 (which may be of any suitable type) may identify both absolute and progressive positions of the shaft to the control system (not shown). As noted before, in the aspects of the disclosed embodiment, the θ drive system may be arranged to provide about 270° or θ rotation. Accordingly, this allows the transport system to rotate a carrier at least about ±90° from any initial orientation. In other aspects, the θ drive system may have any desired configuration and may be capable of rotating the carrier through any desired range of rotation.

In other aspects, cylindrical carrier nests can be placed as desired to allow for higher storage density in the FAB. The cylindrical storage nests can hold carriers one on top of another and provide a mechanism for raising or lowering carriers to a specified height. The mechanism for the vertical motion can be pneumatic, mechanical, or magnetic.

Figure 11:
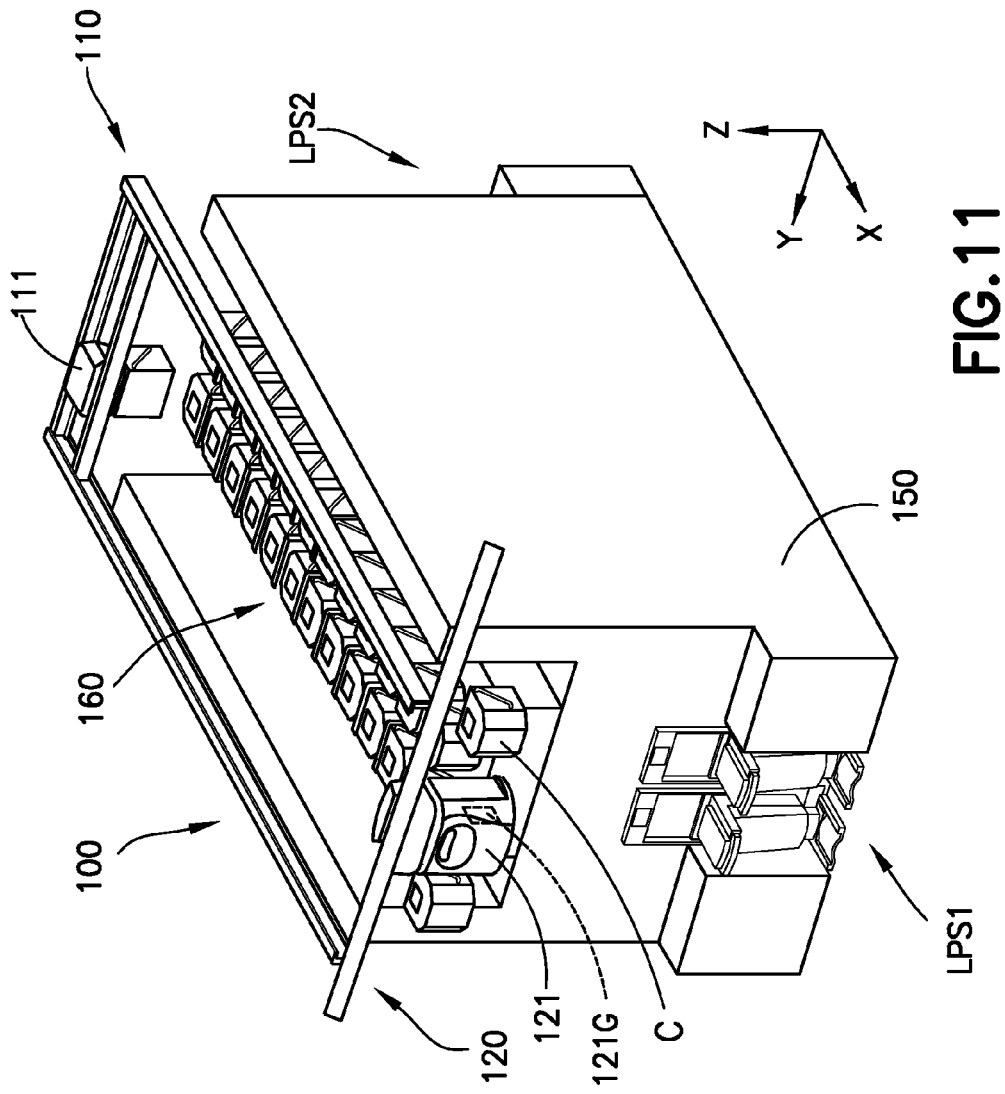
FIG. 11 is an isometric schematic illustration of a transport system in accordance with an aspect of the disclosed embodiments.

FIG. 11 is a schematic illustration of a transport system 100 in accordance with an aspect of the disclosed embodiments. The transport system may include an overhead transport system 120 and a gantry system 110 in communication with the overhead transport system 120. The gantry system 110 and overhead transport system 120 may be substantially similar (unless otherwise indicated) to those described above. The transport system 100 may be configured to provide one or more substrate cassettes C to the load port modules LPS1, LPS2 of a processing tool 150 and/or to any suitable overhead storage or buffer location 160. It is noted that while two load port modules are shown on respective ends of the processing tool 150 in other aspects there may be any suitable number of load port modules disposed at or adjacent to one or more sides (e.g. the ends and/or lateral sides) of the processing tool 150.

Figure 12:
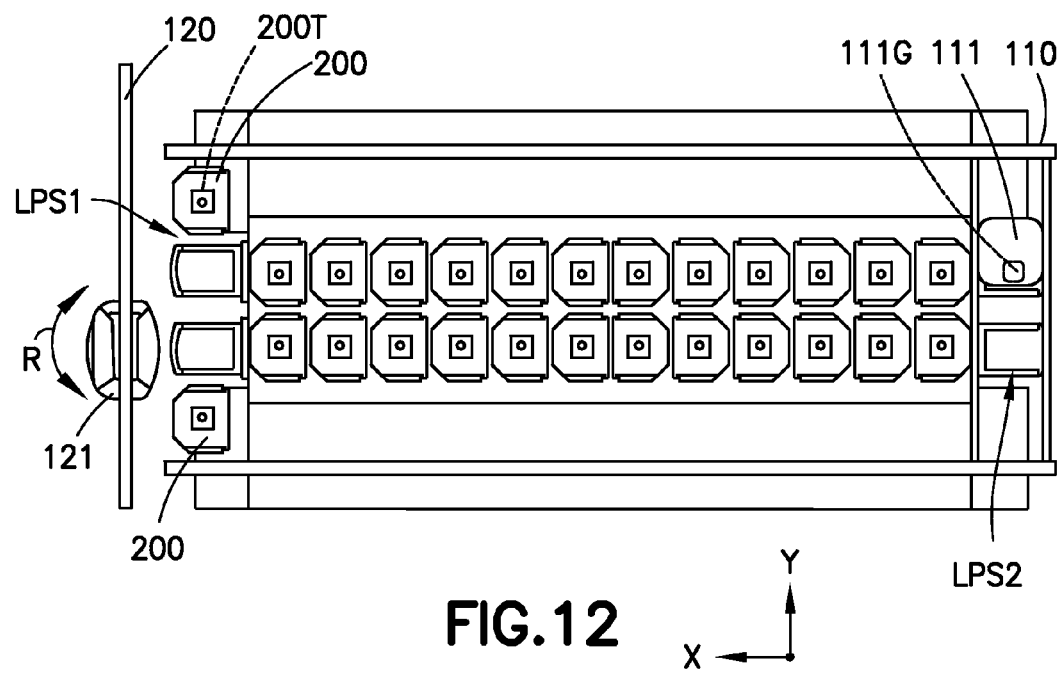
FIG. 12 is a top schematic illustration of the transport system of FIG. 11.
Figure 13:
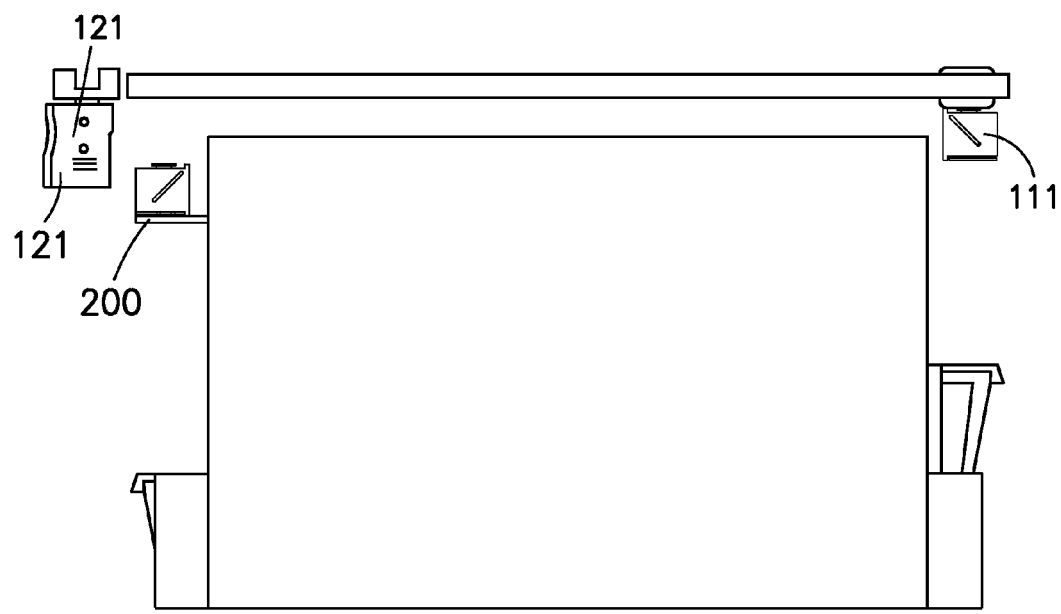
FIG. 13 is a side schematic illustration of the transport system of FIG. 11.
Figure 14:
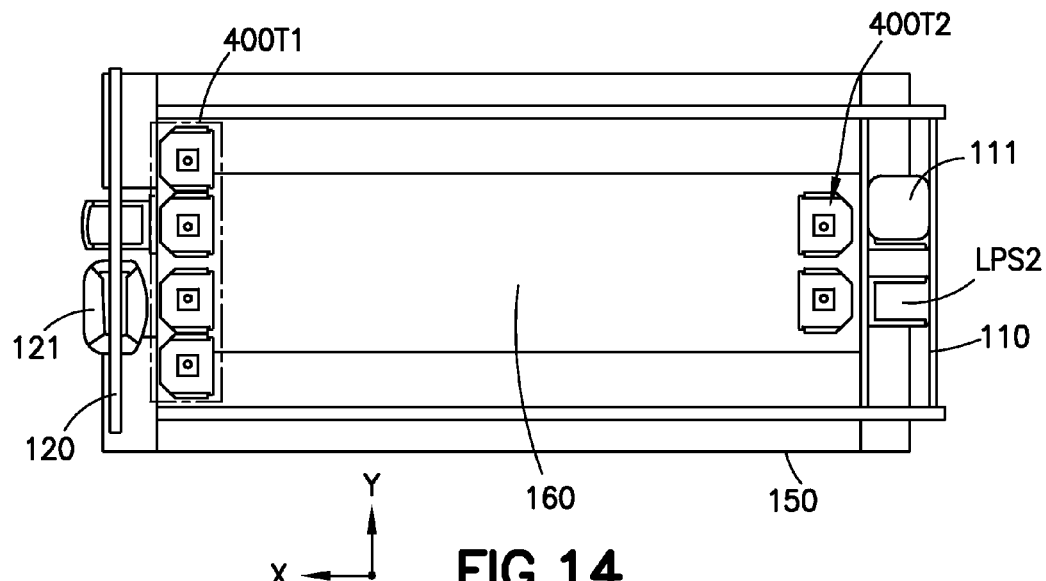
FIGS. 14 and 15 are top schematic illustration of the transport system of FIG. 11 in accordance with aspects of the disclosed embodiments.
Figure 15:
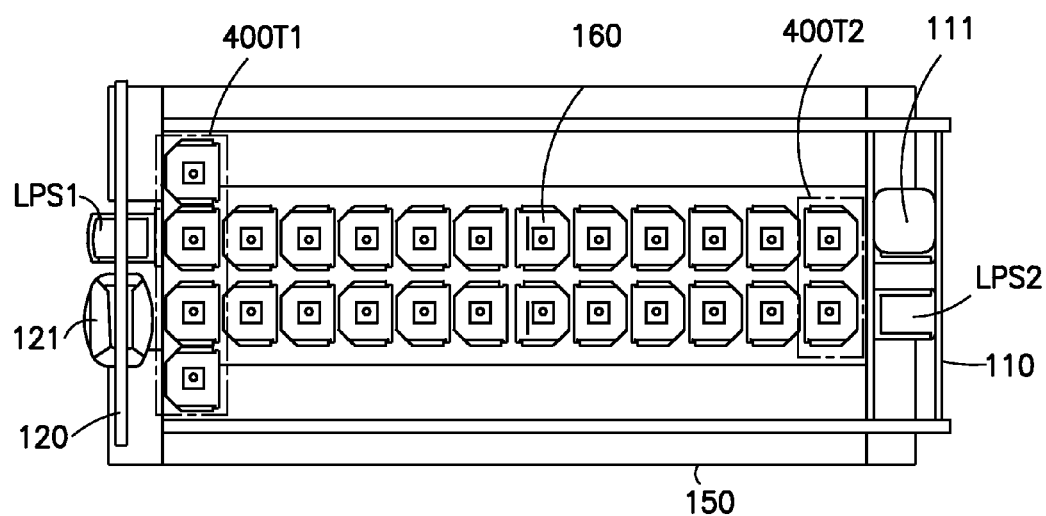
Figure 16:
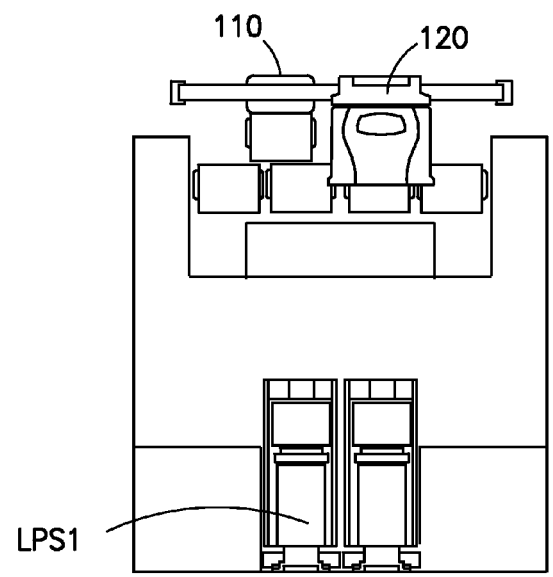
FIGS. 16 and 17 are side schematic illustration of the transport system of FIG. 11 in accordance with aspects of the disclosed embodiments.
Figure 17:
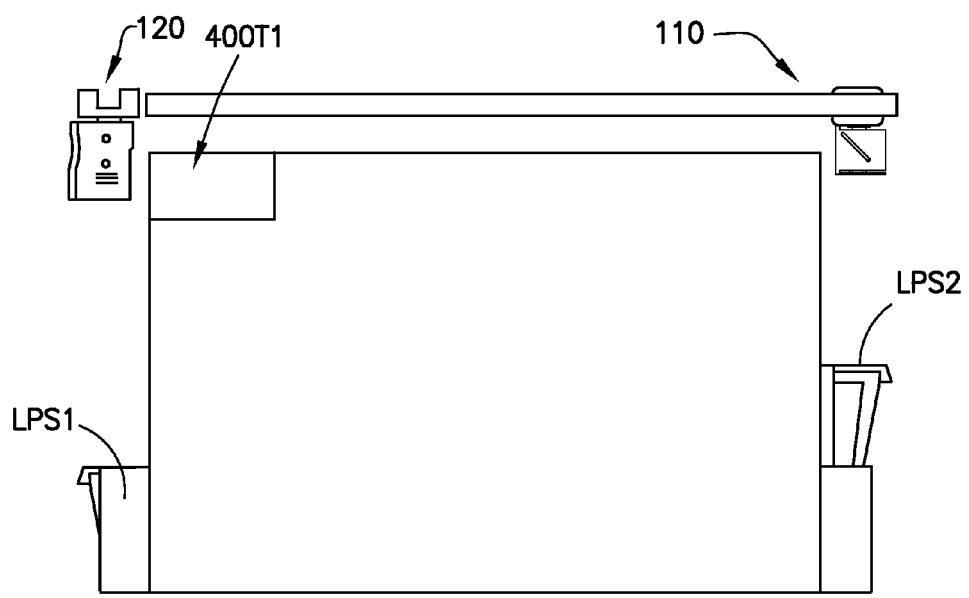
Figure 18:
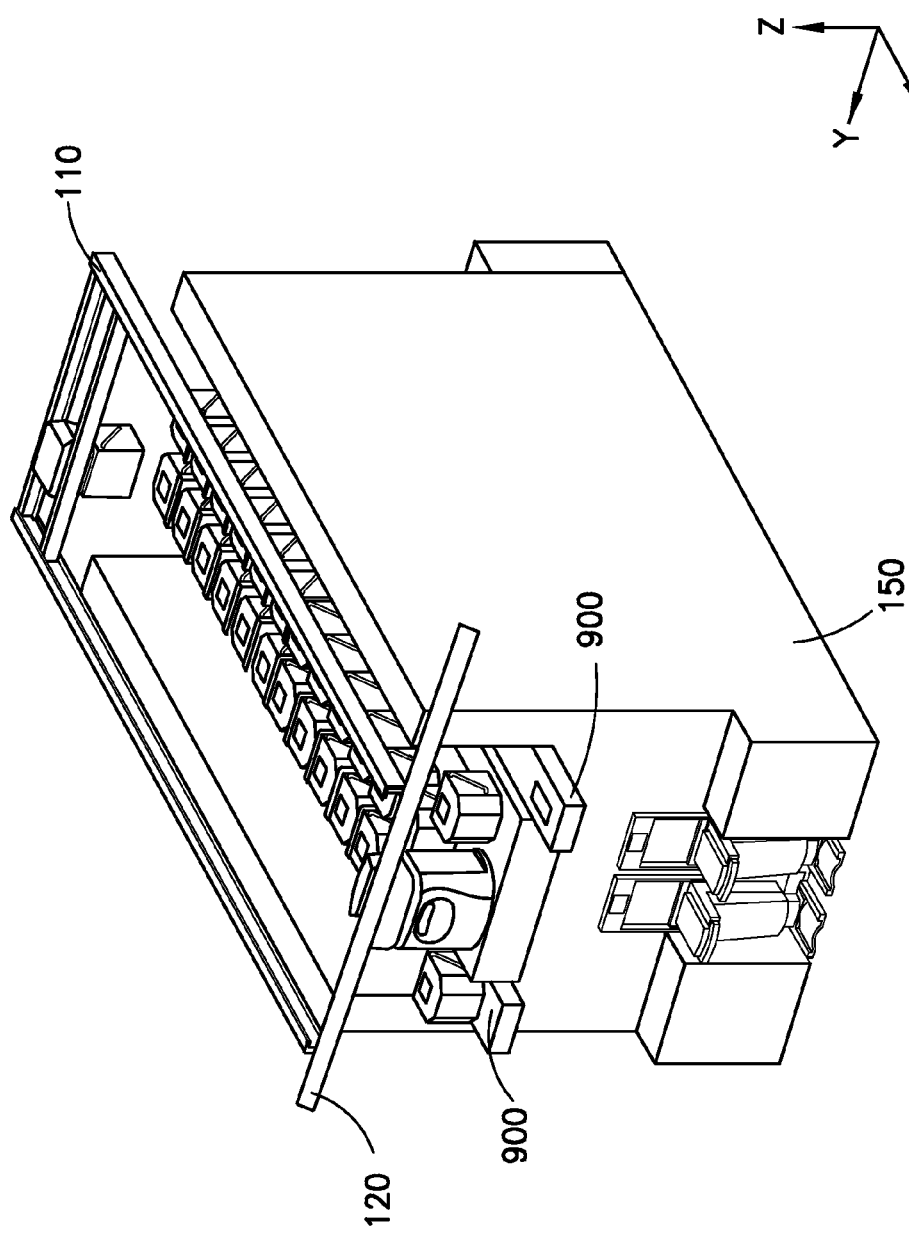
FIG. 18 is an isometric schematic illustration of a transport system in accordance with an aspect of the disclosed embodiments.
Figure 19:
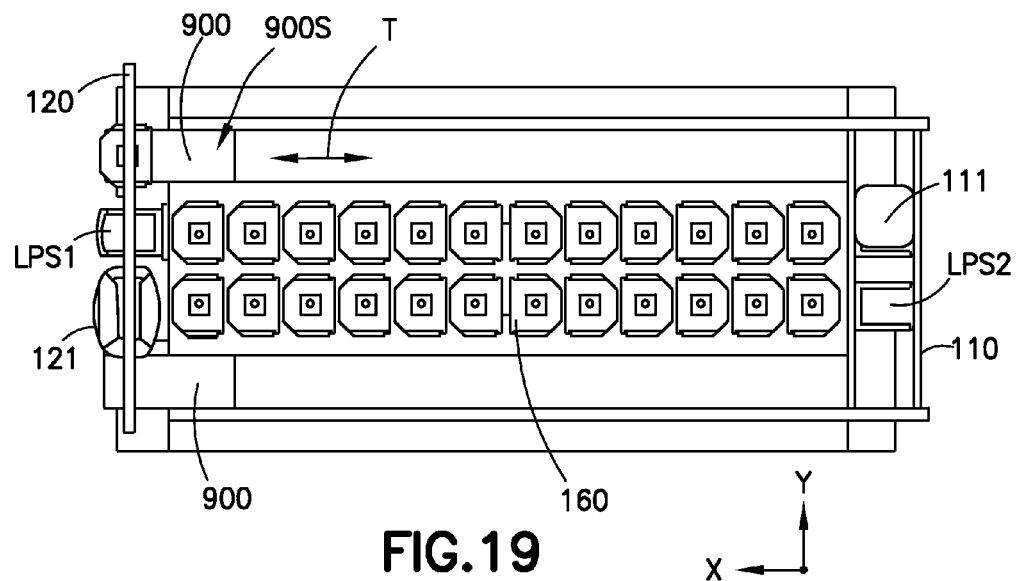
FIG. 19 is a top schematic illustration of the transport system of FIG. 18.
Figure 20:
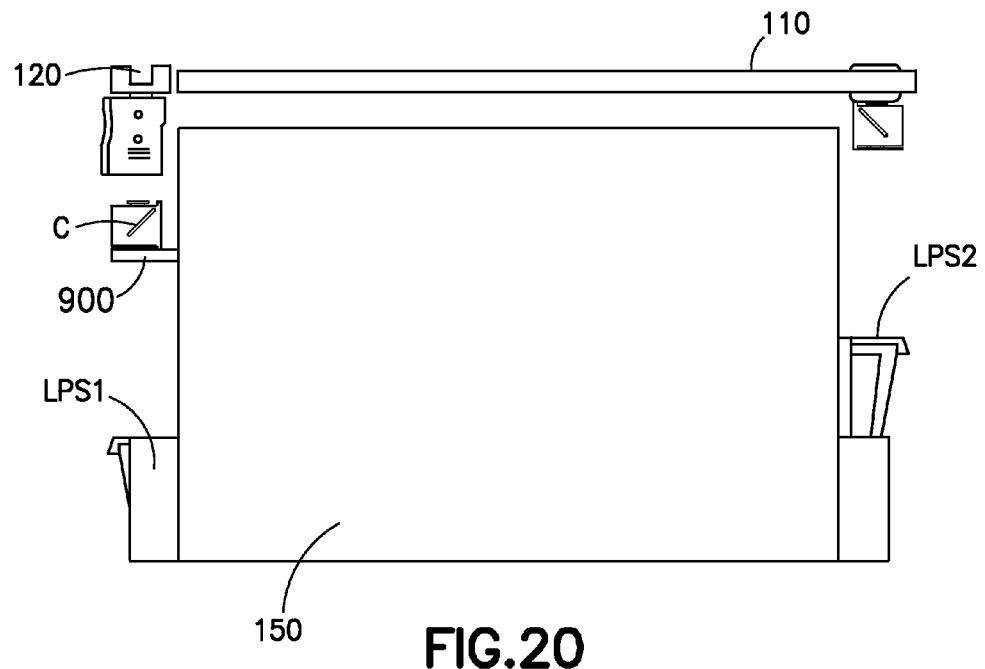
FIG. 20 is a side schematic illustration of the transport system of FIG. 18.
Figure 21C:
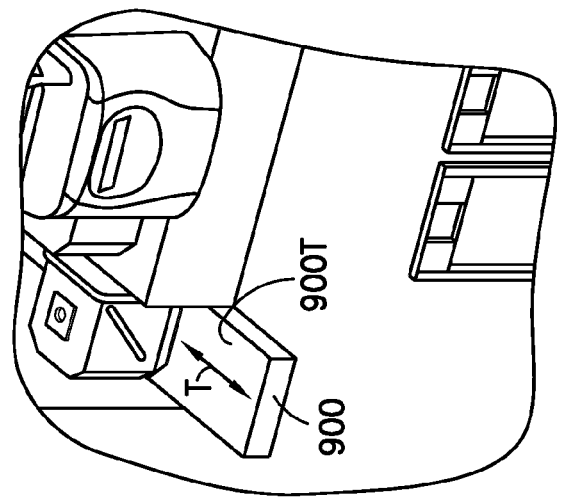
FIGS. 21A-21C are schematic illustrations of a portion of the transport system of FIG. 18 in accordance with an aspect of the disclosed embodiments.
Figure 21B:
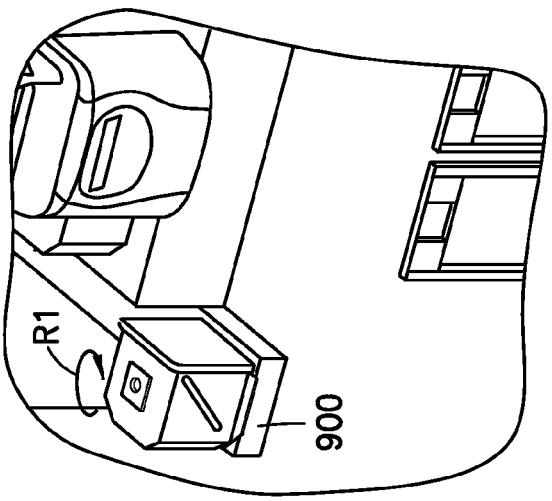
Figure 21A:
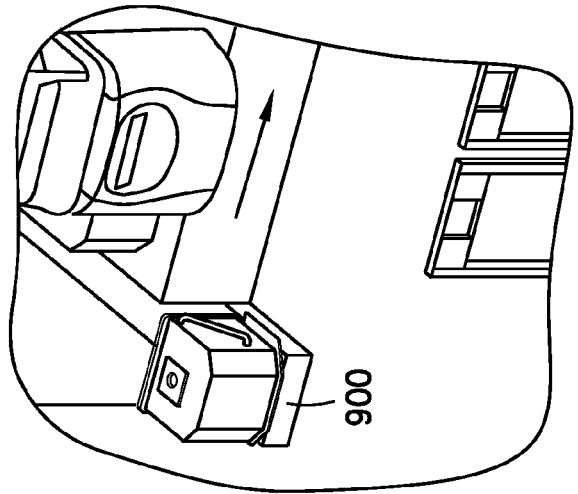

In this aspect, referring also to FIGS. 12 and 13 the overhead transport system 120 may include a shuttle 121 configured to travel along a track of the overhead transport system 120 for transporting cassettes C to and from the tool 150. The shuttle 121 may be configured to interface with one or more of the gantry system 110 and the load port modules LPS1 disposed on a first side of the tool 150. The shuttle may include a gripper 121G that is capable of being lowered in the Z direction for placing the cassettes C at the load ports LPS1 or at a nesting or gantry interface locations 200. The gripper 121G may be configured to rotate the cassettes C in the direction of arrow R, in a manner substantially similar to that described above, to orient the cassettes for placement at the load ports LPS1 or the interface locations 200. The shuttle 121 and/or gripper 121G may also be configured to extend in the X direction in any suitable manner so that the cassettes C can be placed at locations that are offset from the track of the overhead transport system 120, such as the load ports LPS1 and the interface locations 200. For example, the gripper may be disposed on or otherwise include extendible/telescopic rails that are capable of extending transversely to the track for offsetting a position of the cassette C relative to the track in a manner substantially similar to that described in U.S. patent application Ser. Nos. 10/682,809 filed on Oct. 9, 2003 and 11/580,697 filed on Oct. 13, 2006, the disclosures of which are incorporated herein by reference in their entireties.

The gantry system 110 includes a rail system that allows a gantry shuttle 111 to travers in the X and Y directions substantially above the tool so that the gantry shuttle can access one or more of the first side and second side of the tool, e.g. for accessing the load ports LPS1 on the first side and/or the load ports LPS2 on the second side as well as the buffer 160 above the tool. The gantry shuttle 111 may also include a gripper 111G that is capable of rotating the cassettes C in a manner substantially similar to that described above with respect to shuttle 121. It is noted that, in one aspect, the interface between the overhead transport system 120 and the gantry system 110 is through, for example, the interface locations 200 where the shuttle 121 places cassettes at the interface locations 200 and the gantry shuttle 11 moves the cassettes from the interface locations 200 to a buffer 160 location or to one of the load ports LPS1, LPS2. In other aspects the interface between the overhead transport system 120 and the gantry system 110 may occur in any suitable manner.

The interface sections 200 may also include any suitable turntable 200T (which may be substantially similar to the θ drive system described above) for rotating the cassettes for placement at either of the load ports LPS1, LPS2. It is noted that while only two interface sections 200 are shown on opposite lateral sides of the tool, in other aspects there may be any suitable number of interface sections disposed along the end of the tool.

Referring now to FIGS. 14-17 the overhead transport system 120 may be moved closer (e.g. in the X direction) to the tool 150 so that the shuttle 121 may place cassettes C at the load port LPS1 substantially without the gripper 121G travelling in the X direction. In this aspect the interface sections 400T1 (which are substantially similar to interface sections 200) may be moved above the tool 150 offset from the load ports (e.g. in the X direction). In this aspect the shuttle 121 and/or gripper 121G may extend in the X direction in a manner substantially similar to that described above for placing the cassettes C on the interface sections 400T1. Here the number of interface sections 400T1 may be increased because the interface section can span, for example a width of the tool substantially without interfering with overhead transport system access to the load ports LPS1. In other aspects the overhead transport system 120 may be disposed substantially over the tool 150 in any suitable manner. In still other aspects the overhead transport system 120 may be disposed to run along a length of one or more lateral sides of the tool 150 where one or more load ports, nesting locations and/or interface sections are disposed at or adjacent to the lateral sides. As may be realized, in the aspects of the disclosed embodiment the gantry may be configured to access load ports, nesting locations or any other suitable interface sections disposed at the ends and/or lateral sides of the tool 150. In one aspect nesting locations 400T2 may also be located at the second end (and/or lateral sides) of the tool 150 to allow the gantry shuttle 111 to fast swap (e.g. place one cassette and pick another cassette from the nesting locations in rapid succession substantially without movement of the gantry shuttle in one or more of the X, Y or Z directions) cassettes C at the load ports LPS2 located at the second side of the tool 150. In this aspect the gantry system 110 may serve the load ports LPS2 on the second side of the tool 150 while the overhead transport system 120 serves the load ports PS1 on the first side of the tool. In other aspects the gantry system may be configured to serve the load ports on both sides of the tool 150 as described above.

Referring now to FIGS. 18-21C the transport system is substantially similar to those described above however in this aspect the interface locations 900 include a shuttle 900S that is configured to move in the direction of arrow T. While only two interface shuttles 900S are shown it should be understood that any suitable number of interface shuttles may be provided. In one aspect the shuttle 900S may be configured to move between an extended position (similar to the location of interface locations 200 in FIGS. 11-13) and a retracted position (similar to the location of interface locations 400T1 in FIGS. 14-17). For example, the interface shuttle 900S may extend in the direction of arrow T underneath the overhead transport system shuttle 121 so that the shuttle 121 may place a cassette C onto the interface shuttle 900S without substantially moving the gripper 121G in the X direction. The interface shuttle 900S may retract to position the cassette C in a location suitable for the gantry shuttle 111 to access the cassette C for transporting the cassette C to a buffer 160 location and/or to the load ports LPS2. It is noted that the interface shuttle 900S may also include a turntable (which may be substantially similar to the θ drive system described above) for rotating the cassettes in the direction of R2 for orienting the cassettes for placement at the load ports LPS1, LPS2 and/or the buffer 160 locations. In another aspect the interface shuttle 900S may be configured to traverse any suitable length of the tool 1510 in the direction of arrow T such as on tracks or any suitable guide.

In one aspect, each interface shuttle 900S may be configured for movement, in any suitable manner, in both the X and Y directions such that as cassettes are placed on the interface shuttle 900S by the shuttle 121, the interface shuttle 900S can move the cassette(s) C to a predetermined location within the buffer 160. For example, the track system of the interface shuttle 900S may be substantially similar to the gantry system 110, however the interface shuttle 900S is configured to hold the cassette C from the bottom rather than the top. The buffer 160 may be configured to allow the interface shuttle 900S to travel below the buffer 160 while the cassette is supported on any suitable supports extending from the interface shuttle 900S. The interface shuttle 900S and/or supports may also be movable in the Z-direction such that the cassette C can be lowered by the interface shuttle onto any suitable supports of the buffer 160.

In accordance with one or more aspects of the disclosed embodiment a transport system is provided. The transport system includes a first transport and a second transport. The first transport being configured to transport cassettes to and from a processing tool and the second transport is configured to interface with the first transport system and transport cassettes between opposing ends of the processing tool.

In accordance with one or more aspects of the disclosed embodiment a semiconductor workpiece processing is provided and includes at least one substrate processing tool for processing semiconductor substrates, the at least one substrate processing tool has a common housing with a first side having a first substrate holding container interface and a second side having a second substrate holding container interface having a different orientation than the first substrate holding container interface, a first transport section elongated and defining a travel direction, and having parts, that interface a substrate holding container, supporting and transporting the substrate holding container along the travel direction, the first transport section being disposed corresponding to the first side of the at least one substrate processing tool, a second transport section being separate and distinct from the first transport section, the second transport section interfacing with the first transport section and being configured to transport the substrate holding container between the first transport section and the at least one substrate processing tool and between the first side and the second side of the at least one substrate processing tool, the second transport section including at least one overhead gantry disposed above the at least one substrate processing tool, where the second transfer section is capable of interfacing with at least the second substrate holding container interface.

In accordance with one or more aspects of the disclosed embodiment the at least one overhead gantry includes at least one overhead carrier having at least three degrees of freedom.

In accordance with one or more aspects of the disclosed embodiment the substrate holding container has an access side and the at least one overhead carrier includes a rotational drive configured to rotate the substrate holding container carried by the at least one overhead carrier to change a direction in which the access side faces.

In accordance with one or more aspects of the disclosed embodiment the semiconductor workpiece processing system further includes at least one overhead storage station disposed above the at least one substrate processing tool, the second transport section being configured to transport substrate holding containers to and from the at least one overhead storage station.

In accordance with one or more aspects of the disclosed embodiment the first transport section is configured to service load ports on the first end of the at least one substrate processing tool and the at least one overhead gantry is configured to service opposingly arranged load ports on the opposing second end of the at least one substrate processing tool.

In accordance with one or more aspects of the disclosed embodiment the at least one overhead gantry is configured to service opposingly arranged load ports on opposite ends of the at least one substrate processing tool.

In accordance with one or more aspects of the disclosed embodiment the at least one overhead gantry includes at least one carrier configured to rotate a substrate holding container carried by the carrier so that an orientation of the substrate holding container corresponds to an orientation of a respective one of the opposingly arranged load ports.

In accordance with one or more aspects of the disclosed embodiment the at least one carrier is configured for on the fly rotation of the substrate holding container.

In accordance with one or more aspects of the disclosed embodiment the first transport section is located on a first end of the at least one substrate processing tool.

In accordance with one or more aspects of the disclosed embodiment the second transport section is configured to transport the substrate holding container between a first end and an opposing second end of the at least one substrate processing tool.

In accordance with one or more aspects of the disclosed embodiment a semiconductor workpiece processing system includes at least one substrate processing tool for processing semiconductor substrates, a first transport section configured to transport substrate holding containers and defining a travel direction, the first transport section being located on a first end of the at least one substrate processing tool, at least one substrate holding container storage disposed above the at least one substrate processing tool, a feeder shuttle that interfaces with and crosses the travel direction of the first transport section for transporting the substrate holding containers between the first transport section and the at least one substrate holding container storage, and a second transport section that is separate and distinct from the first transport section and interfacing with at least the at least one substrate holding container storage, the second transport section being configured to transport substrate holding containers between the at least one substrate holding container storage and the at least one substrate processing tool and between the first end and an opposing second end of the at least one substrate processing tool, the second transport section including at least one overhead gantry disposed above the at least one substrate processing tool.

In accordance with one or more aspects of the disclosed embodiment the second transport section is disposed above the feeder shuttle such that an overhead carrier of the at least one overhead gantry carrying a substrate holding container is capable of passing over the feeder shuttle.

In accordance with one or more aspects of the disclosed embodiment the at least one overhead gantry includes at least one overhead carrier having at least three degrees of freedom.

In accordance with one or more aspects of the disclosed embodiment the substrate holding container has an access side and the at least one overhead carrier includes a rotational drive configured to rotate a substrate holding container carried by the at least one overhead carrier to change a direction in which the access side faces.

In accordance with one or more aspects of the disclosed embodiment the feeder shuttle includes a rotational drive configured to rotate a substrate holding container carried by the feeder shuttle.

In accordance with one or more aspects of the disclosed embodiment the first transport section is configured to service load ports on the first end of the at least one substrate processing tool and the at least one overhead gantry is configured to service opposingly arranged load ports on the opposing second end of the at least one substrate processing tool.

In accordance with one or more aspects of the disclosed embodiment the at least one gantry is configured to service opposingly arranged load ports of the at least one substrate processing tool.

In accordance with one or more aspects of the disclosed embodiment the at least one overhead gantry includes at least one carrier configured to rotate a substrate holding container carried by the carrier so that an orientation of the substrate holding container corresponds to an orientation of a respective one of the opposingly arranged load ports.

In accordance with one or more aspects of the disclosed embodiment the at least one carrier is configured for on the fly rotation of the substrate holding container.

In accordance with one or more aspects of the disclosed embodiment the feeder shuttle comprises two feeder shuttles that are disposed side by side.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A semiconductor workpiece processing system comprising:
   at least one substrate processing tool for processing semiconductor substrates, the at least one substrate processing tool has a common housing with a first side having a first substrate holding container interface and a second side having a second substrate holding container interface having a different orientation than the first substrate holding container interface;
   a first transport section elongated and defining a travel direction, and having parts, that interface a substrate holding container, supporting and transporting the substrate holding container along the travel direction, the first transport section being disposed corresponding to the first side of the at least one substrate processing tool;
   a second transport section being separate and distinct from the first transport section, the second transport section interfacing with the first transport section and being configured to transport the substrate holding container between the first transport section and the at least one substrate processing tool and between the first side and the second side of the at least one substrate processing tool, the second transport section including at least one overhead gantry disposed above the at least one substrate processing tool, where the second transfer section is configured to interface with at least the second substrate holding container interface.

2. The semiconductor workpiece processing system of claim 1, where the at least one overhead gantry includes at least one overhead carrier having at least three degrees of freedom.

3. The semiconductor workpiece processing system of claim 2, where the substrate holding container has an access side and the at least one overhead carrier includes a rotational drive configured to rotate the substrate holding container carried by the at least one overhead carrier to change a direction in which the access side faces.

4. The semiconductor workpiece processing system of claim 1, further comprising at least one overhead storage station disposed above the at least one substrate processing tool, the second transport section being configured to transport substrate holding containers to and from the at least one overhead storage station.

5. The semiconductor workpiece processing system of claim 1, wherein the first transport section is configured to service load ports on the first end of the at least one substrate processing tool and the at least one overhead gantry is configured to service opposingly arranged load ports on the opposing second end of the at least one substrate processing tool.

6. The semiconductor workpiece processing system of claim 1, wherein the at least one overhead gantry is configured to service opposingly arranged load ports on opposite ends of the at least one substrate processing tool.

7. The semiconductor workpiece processing system of claim 6, wherein the at least one overhead gantry includes at least one carrier configured to rotate a substrate holding container carried by the carrier so that an orientation of the substrate holding container corresponds to an orientation of a respective one of the opposingly arranged load ports.

8. The semiconductor workpiece processing system of claim 7, wherein the at least one carrier is configured for on the fly rotation of the substrate holding container.

9. The semiconductor workpiece processing system of claim 1, wherein the first transport section is located on a first end of the at least one substrate processing tool.

10. The semiconductor workpiece processing system of claim 1, wherein the second transport section is configured to transport the substrate holding container between a first end and an opposing second end of the at least one substrate processing tool.

11. A semiconductor workpiece processing system comprising:
at least one substrate processing tool for processing semiconductor substrates;
a first transport section configured to transport substrate holding containers and defining a travel direction, the first transport section being located on a first end of the at least one substrate processing tool;
at least one substrate holding container storage disposed above the at least one substrate processing tool;
a feeder shuttle that interfaces with and crosses the travel direction of the first transport section for transporting the substrate holding containers between the first transport section and the at least one substrate holding container storage; and
a second transport section that is separate and distinct from the first transport section and interfacing with at least the at least one substrate holding container storage, the second transport section being configured to transport substrate holding containers between the at least one substrate holding container storage and the at least one substrate processing tool and between the first end and an opposing second end of the at least one substrate processing tool, the second transport section including at least one overhead gantry disposed above the at least one substrate processing tool.

12. The semiconductor workpiece processing system of claim 11, wherein the second transport section is disposed above the feeder shuttle such that an overhead carrier of the at least one overhead gantry carrying a substrate holding container is capable of passing over the feeder shuttle.

13. The semiconductor workpiece processing system of claim 11, where the at least one overhead gantry includes at least one overhead carrier having at least three degrees of freedom.

14. The semiconductor workpiece processing system of claim 13, where the substrate holding container has an access side and the at least one overhead carrier includes a rotational drive configured to rotate a substrate holding container carried by the at least one overhead carrier to change a direction in which the access side faces.

15. The semiconductor workpiece processing system of claim 11, where the feeder shuttle includes a rotational drive configured to rotate a substrate holding container carried by the feeder shuttle.

16. The semiconductor workpiece processing system of claim 11, wherein the first transport section is configured to service load ports on the first end of the at least one substrate processing tool and the at least one overhead gantry is configured to service opposingly arranged load ports on the opposing second end of the at least one substrate processing tool.

17. The semiconductor workpiece processing system of claim 11, wherein the at least one gantry is configured to service opposingly arranged load ports of the at least one substrate processing tool.

18. The semiconductor workpiece processing system of claim 17, wherein the at least one overhead gantry includes at least one carrier configured to rotate a substrate holding container carried by the carrier so that an orientation of the substrate holding container corresponds to an orientation of a respective one of the opposingly arranged load ports.

19. The semiconductor workpiece processing system of claim 18, wherein the at least one carrier is configured for on the fly rotation of the substrate holding container.

20. The semiconductor workpiece processing system of claim 11, wherein the feeder shuttle comprises two feeder shuttles that are disposed side by side.

* * * * *